US010193305B2

(12) United States Patent
Kawakita et al.

(10) Patent No.: US 10,193,305 B2
(45) Date of Patent: Jan. 29, 2019

(54) WAVELENGTH TUNABLE LASER DEVICE AND LASER MODULE

(71) Applicant: FURUKAWA ELECTRIC CO., LTD., Tokyo (JP)

(72) Inventors: Yasumasa Kawakita, Tokyo (JP); Yasutaka Higa, Tokyo (JP); Norihiro Iwai, Tokyo (JP); Tatsuro Kurobe, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/708,994

(22) Filed: Sep. 19, 2017

(65) Prior Publication Data

US 2018/0026426 A1    Jan. 25, 2018

Related U.S. Application Data

(63) Continuation of application No. PCT/JP2016/053463, filed on Feb. 5, 2016.
(Continued)

(30) Foreign Application Priority Data

Jan. 20, 2016  (JP) ................................ 2016-008579

(51) Int. Cl.
*H01S 5/14* (2006.01)
*G02B 5/28* (2006.01)
(Continued)

(52) U.S. Cl.
CPC .............. *H01S 5/142* (2013.01); *G02B 5/284* (2013.01); *H01S 5/0085* (2013.01); *H01S 5/026* (2013.01);
(Continued)

(58) Field of Classification Search
CPC ......... H01S 5/206; H01S 5/0625; H01S 5/142
See application file for complete search history.

(56) References Cited

U.S. PATENT DOCUMENTS 5,841,799 A * 11/1998 Hiroki .................... B82Y 20/00
372/19
6,141,370 A * 10/2000 Avrutsky ............ H01S 5/06256
372/102
(Continued)

FOREIGN PATENT DOCUMENTS

JP    2008-66318 A    3/2008
JP    2009-49083 A    3/2009

OTHER PUBLICATIONS

English translation of Written Opinion (PCT/ISA/237) issued in PCT/JP2016/053463 dated May 2016.
(Continued)

*Primary Examiner* — Michael Carter
(74) *Attorney, Agent, or Firm* — Chen Yoshimura LLP

(57) ABSTRACT

A wavelength tunable laser device includes: a laser cavity formed of a grating and a reflecting mirror including a ring resonator filter; a gain portion; and a phase adjusting portion. The grating creates a first comb-shaped reflection spectrum. The ring resonator filter includes a ring-shaped waveguide and two arms and creates a second comb-shaped reflection spectrum having peaks of a narrower full width than peaks in the first comb-shaped reflection spectrum at a wavelength interval different from that of the first comb-shaped reflection spectrum. One of the peaks in the first comb-shaped reflection spectrum and one of the peaks in the second comb-shaped reflection spectrum are overlapped on a wavelength axis, and a spacing between cavity modes is narrower than the full width at half maximum of the peaks in the first comb-shaped reflection spectrum.

20 Claims, 17 Drawing Sheets

Related U.S. Application Data

(60) Provisional application No. 62/135,991, filed on Mar. 20, 2015.

(51) Int. Cl.
  *H01S 5/00* (2006.01)
  *H01S 5/026* (2006.01)
  *H01S 5/06* (2006.01)
  *H01S 5/0687* (2006.01)
  H01S 5/024 (2006.01)
  H01S 5/0625 (2006.01)
  H01S 5/10 (2006.01)
  H01S 5/12 (2006.01)
  H01S 5/227 (2006.01)

(52) U.S. Cl.
  CPC .......... *H01S 5/0612* (2013.01); *H01S 5/0687* (2013.01); *H01S 5/0261* (2013.01); *H01S 5/02415* (2013.01); *H01S 5/06256* (2013.01); *H01S 5/1014* (2013.01); *H01S 5/1021* (2013.01); *H01S 5/1032* (2013.01); *H01S 5/1209* (2013.01); *H01S 5/2275* (2013.01)

(56) References Cited

U.S. PATENT DOCUMENTS

| | | |
|---|---|---|
| 6,590,924 B2 | 7/2003 | Fish et al. |
| 7,149,381 B2 | 12/2006 | Margalit et al. |
| 8,422,530 B2 | 4/2013 | Yoon |
| 8,467,122 B2 * | 6/2013 | Zheng ............... H01S 5/142 359/333 |
| 2002/0015433 A1 * | 2/2002 | Zimmermann ......... H01S 5/026 372/96 |
| 2002/0105990 A1 * | 8/2002 | Fish ..................... B82Y 20/00 372/50.1 |
| 2006/0127007 A1 | 6/2006 | Margalit et al. |
| 2009/0046748 A1 | 2/2009 | Kato |
| 2011/0013654 A1 * | 1/2011 | Yamazaki ............. H01S 5/0687 372/29.02 |
| 2011/0310918 A1 * | 12/2011 | Yoon ..................... H01S 5/026 372/26 |
| 2016/0204576 A1 * | 7/2016 | Chen .................... H01S 5/0612 372/20 |

OTHER PUBLICATIONS

Lin Wu et al., "Wavelength Switchable Semiconductor Laser Based on Half-Wave Coupled Fabry-Perot and Rectangular Ring Resonators", IEEE Photonics Technology Letters, Jun. 15, 2012, vol. 24, No. 12, 991-993.

Larry A. Coldren et al., "Tunable Semiconductor Lasers: A Tutorial", Journal of Lightwave Technology, vol. 22, No. 1, Jan. 2004, pp. 193-202.

Keita Nemoto et al., "Nattow-Spectral-Linewidth Wavelength-Tunable Laser Diode with Si Wire Waveguide Ring Resonators", Applied Physics Express 5 (2012) 082701.

International Search Report (ISR) issued in PCT/JP2016/053463 dated May 2016.

Written Opinion (PCT/ISA/237) issued in PCT/JP2016/053463 dated May 2016.

* cited by examiner

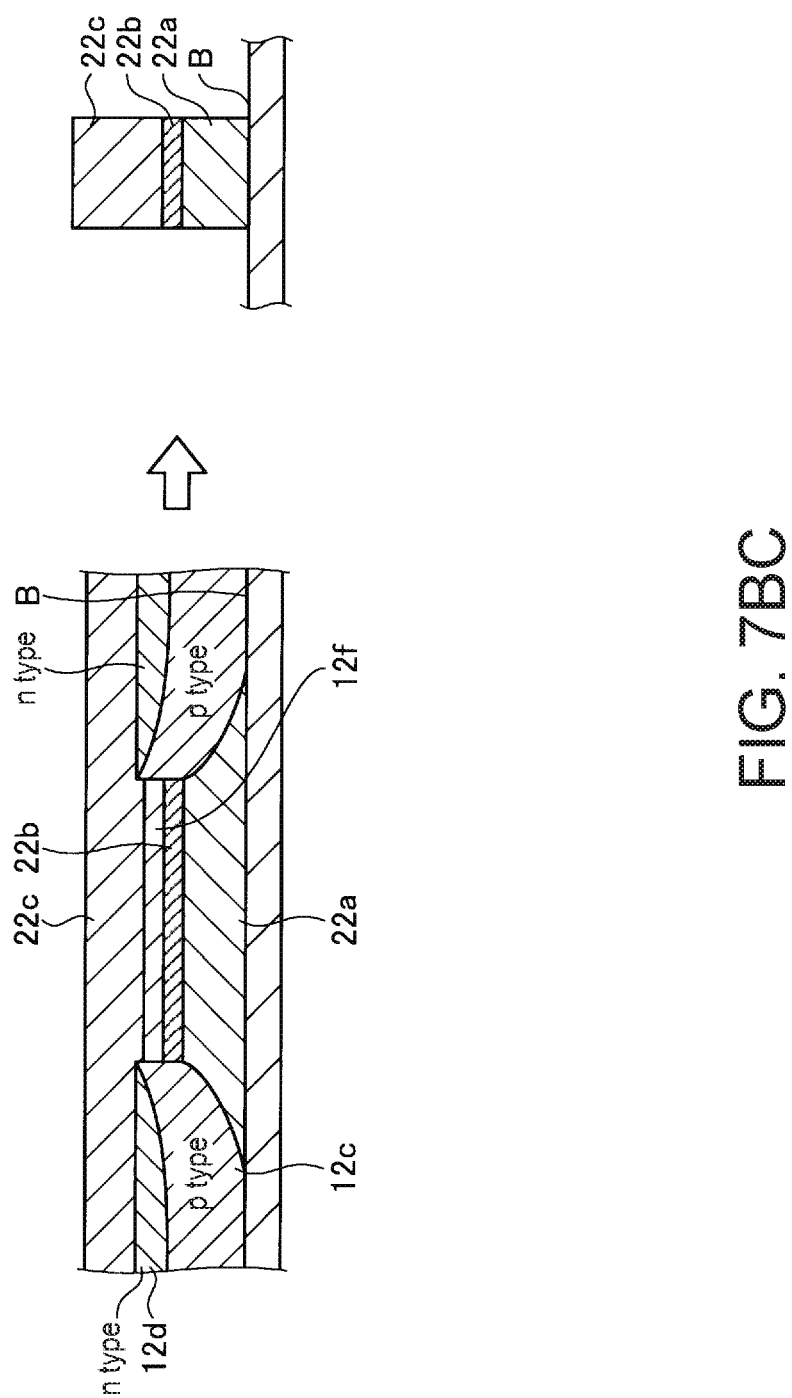

WAVELENGTH TUNABLE LASER DEVICE AND LASER MODULE

BACKGROUND OF THE INVENTION

Technical Field

The present invention relates to a wavelength tunable laser device and a laser module using the same.

Background Art

As coherent communication technologies have become more common, demand for narrow-linewidth wavelength tunable laser devices has increased. The configuration and principle of operation of wavelength tunable laser devices are described in detail in Non-Patent Document 1, for example. In general, reducing the linewidth of laser light output from a semiconductor laser device requires elongating the cavity. One known type of wavelength tunable laser device is the distributed Bragg reflector (DBR) variable wavelength laser, which utilizes a sampled grating to take advantage of the Vernier effect (see Patent Document 1, for example). In this type of wavelength tunable laser device, two DBRs in which portions of a diffraction grating are sampled are used in a semiconductor device. The reflection spectrums of these two DBR mirrors are comb-shaped with slightly different pitches. Moreover, changing the refractive indices of the DBR mirrors by injecting current or applying heat makes it possible to alter the exhibited reflection wavelength characteristics. Combining the reflection characteristics of the two DBR mirrors increases reflectance within a prescribed wavelength region and makes it possible to form a cavity. Here, designing the cavity length appropriately allows the spacing of longitudinal modes (one type of cavity mode) to be approximately the same as the reflection bandwidth of the two DBR mirrors, thereby resulting in selection of just a single cavity mode and achieving single-mode oscillation.

Another method for producing narrow-linewidth laser light involves using an external cavity structure to increase the resonant length and increase the Q factor of cavity modes, for example. Moreover, in wavelength tunable laser devices in which the cavities are configured using two ring resonators, for example, utilizing the overlap between the relatively sharp filtering characteristics (reflection wavelength characteristics) of the ring resonators makes it possible to design the structure of the cavity freely (see Non-Patent Document 2, for example).

RELATED ART DOCUMENT

Patent Document

Patent Document 1: U.S. Pat. No. 6,590,924

Non-Patent Documents

Non-Patent Document 1: Larry A. Coldren et al., "Tunable Semiconductor Lasers: A Tutorial", JOURNAL OF LIGHTWAVE TECHNOLOGY, VOL. 22, NO. 1, JANUARY 2004, pp. 193-202

Non-Patent Document 2: Keita Nemoto et al., "Narrow-Spectral-Linewidth Wavelength-Tunable Laser Diode with Si Wire Waveguide Ring Resonators", Applied Physics Express 5 (2012) 082701

SUMMARY OF THE INVENTION

However, in DBR wavelength tunable laser devices of the type described above, elongating the cavity enough to obtain the narrow-linewidth laser light needed for coherent communications reduces the longitudinal mode spacing and makes it difficult to select just one cavity mode within the reflection bandwidth of the cavity, thereby making it fundamentally more difficult to achieve single-mode oscillation.

Moreover, in a wavelength tunable laser device in which the cavity is configured using two ring resonators, any offset between the center wavelengths of the sharp reflection wavelength characteristics of the two results in large variations in reflectance in the overlapping portions. Therefore, the peaks of the sharp reflection wavelength characteristics of the two ring resonators must be reliably aligned in order to achieve stable laser oscillation; however, achieving this degree of control is difficult.

The present invention was made in light of the foregoing and aims to provide a wavelength tunable laser device and a laser module using the same that make it possible to reduce the linewidth of laser light as well as to achieve stable single-mode oscillation. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a wavelength tunable laser device, including: a laser cavity formed of a grating and a reflecting mirror optically coupled to the grating, the reflecting mirror including a ring resonator filter; a gain portion arranged within the laser cavity; and a phase adjusting portion arranged within the laser cavity, wherein the grating forms a first comb-shaped reflection spectrum, wherein the ring resonator filter of the reflecting mirror includes: a ring-shaped waveguide; and two arms that are respectively optically coupled to different points of the ring-shaped waveguide, wherein the reflecting mirror further includes a coupler that unites respective ends of the two arms of the ring resonator filter on one end and that is optically coupled to the grating on another end, wherein the reflecting mirror forms a second comb-shaped reflection spectrum having peaks of a narrower full width at half maximum than a full width at half maximum of peaks in the first comb-shaped reflection spectrum at a wavelength interval differing from a wavelength interval of the first comb-shaped reflection spectrum, wherein the grating and the reflecting mirror are configured such that one of the peaks in the first comb-shaped reflection spectrum and one of the peaks in the second comb-shaped reflection spectrum are overlappable on a wavelength axis, wherein the wavelength tunable laser device is configured to adjust a refractive index of the phase adjusting portion such that one of the cavity modes of the laser cavity enters an overlap region in which the one of the peaks in the first comb-shaped reflection spectrum and the one of the peaks in the second comb-shaped reflection spectrum are overlapped, thereby achieving laser oscillation at a wavelength of the one of the cavity modes, wherein the laser cavity is configured such that a spacing between cavity modes is narrower than the full width at half maximum of the peaks in the first comb-shaped reflection spectrum, and such that two or more of the cavity modes are included within a peak in the first comb-shaped reflection spectrum, and wherein the wavelength tunable laser device is configured to adjust the refractive index of the phase adjusting portion so as to shift the two or more cavity modes on the wavelength axis and align only one of the two or more cavity modes with the overlap region, thereby achieving single mode laser oscillation at the one of the two or more cavity modes.

Moreover, a laser module according to one aspect of the present invention includes the wavelength tunable laser device according to one aspect of the present invention.

The present invention makes it possible to provide a wavelength tunable laser device that reduces the linewidth of the laser light and achieves stable single-mode oscillation.

It is to be understood that both the foregoing general description and the following detailed description are exemplary and explanatory, and are intended to provide further explanation of the invention as claimed.

BRIEF DESCRIPTION OF THE DRAWINGS

FIG. 7AB is a cross-sectional view illustrating an example of a method of manufacturing the wavelength tunable laser device illustrated in FIG. 1.

FIG. 7AC is a cross-sectional view illustrating an example of a method of manufacturing the wavelength tunable laser device illustrated in FIG. 1.

FIG. 7BB is a cross-sectional view illustrating an example of a method of manufacturing the wavelength tunable laser device illustrated in FIG. 1.

FIG. 7BC is a cross-sectional view illustrating an example of a method of manufacturing the wavelength tunable laser device illustrated in FIG. 1.

FIG. 7CB is a cross-sectional view illustrating an example of a method of manufacturing the wavelength tunable laser device illustrated in FIG. 1.

FIG. 7CC is a cross-sectional view illustrating an example of a method of manufacturing the wavelength tunable laser device illustrated in FIG. 1.

DETAILED DESCRIPTION OF EMBODIMENTS

Figure 1:
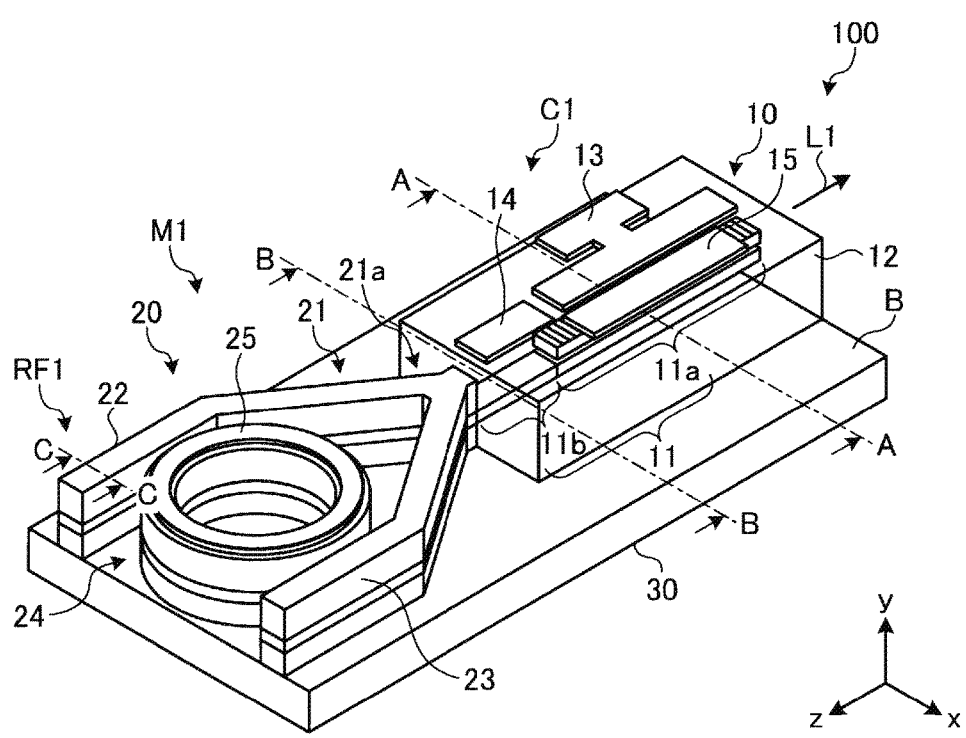
FIG. 1 is a perspective view schematically illustrating a wavelength tunable laser device according to Embodiment 1.

A wavelength tunable laser device according to the present invention takes advantage of the Vernier effect and is configured to have a second comb-shaped reflection spectrum having peaks of a narrower full width at half maximum than a full width at half maximum of peaks in a first comb-shaped reflection spectrum at a wavelength interval different from a wavelength interval of the first comb-shaped reflection spectrum, and is also configured such that a spacing between cavity modes is narrower than the full width at half maximum of the peaks in the first comb-shaped reflection spectrum. This makes it possible to reduce the linewidth of laser light and to achieve stable single-mode oscillation.

Next, embodiments of a wavelength tunable laser device and a laser module according to the present invention will be described in detail with reference to figures. Note, however, that the present invention is not limited by these embodiments in any way. Moreover, in the figures, the same reference characters are used as appropriate for components that are the same or equivalent. Furthermore, the figures are only intended to be schematic illustrations, and the dimensional relationships between the components, the proportions of the components, and the like may be different than in actual configurations. Similarly, the dimensional relationships and proportions illustrated in the figures may differ from one figure to the next. In addition, where appropriate, the figures illustrate XYZ coordinate axes that will be used to describe directions.

Embodiment 1

FIG. 1 is a perspective view schematically illustrating a wavelength tunable laser device according to Embodiment 1. A wavelength tunable laser device 100 is configured to achieve laser oscillation in the 1.55 μm band and output the resulting laser light. The wavelength tunable laser device 100 includes a first waveguide 10 and a second waveguide 20 formed on a common substrate B. The substrate B is made of n-type InP, for example. Moreover, an n-side electrode 30 is formed on the rear surface of the substrate B. The n-side electrode 30 is made of AuGeNi, for example, and is in ohmic contact with the substrate B.

The first waveguide 10 includes a waveguide 11, a semiconductor stack 12, a p-side electrode 13, and microheaters 14 and 15 made of Ti. The waveguide 11 is formed extending in the Z direction within the semiconductor stack 12. A grating loaded gain portion 11a and a phase adjusting portion 11b are arranged within the first waveguide 10. The semiconductor stack 12 is formed by stacking semiconductor layers and functions as cladding or the like for the waveguide 11, for example. The configurations of the waveguide 11 and the semiconductor stack 12 will be described in more detail later.

The p-side electrode 13 is arranged on the semiconductor stack 12 and is aligned with the grating loaded gain portion 11a. The semiconductor stack 12 includes a SiN protective film (described later), and the p-side electrode 13 contacts the semiconductor stack 12 via an opening formed in the SiN protective film. The microheater 14 is arranged on the SiN protective film of the semiconductor stack 12 and is aligned with the phase adjusting portion 11b. The phase adjusting portion 11b in this embodiment is constituted of a portion of a waveguide that is coupled with the microheater 14 thereabove so that the refractive index of the portion of the waveguide can be varied by changing the temperature of the waveguide by the microheater 14, thereby adjusting the phase of propagating light therein. The microheater 15 (a first refractive index changing unit) is arranged on the SiN protective film of the semiconductor stack 12 and runs parallel to the p-side electrode 13.

Figure 2A:
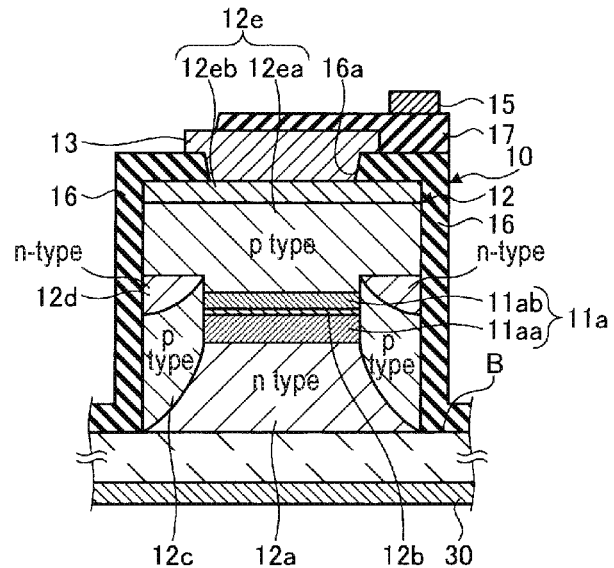
FIG. 2A is a cross-sectional view schematically illustrating the wavelength tunable laser device illustrated in FIG. 1.

FIG. 2A is a cross-sectional view taken along line A-A in a plane parallel to the XY plane in FIG. 1 and illustrating the portion of the first waveguide 10 within which the grating loaded gain portion 11a is included. As illustrated in FIG. 2A, the grating loaded gain portion 11a includes an active core layer 11aa and a grating layer 11ab constituted by a sampled grating arranged near the active core layer 11aa and running directly above the active core layer 11aa.

The active core layer 11aa emits light upon injection of current and includes a multiple quantum well structure constituted by a plurality of well layers and a plurality of barrier layers that are alternately layered together, as well as upper and lower optical confinement layers sandwiching the multiple quantum well structure from above and below. The well layers and the barrier layers in the multiple quantum well structure of the active core layer 11aa are respectively made of InGaAsP materials of different compositions, and in Embodiment 1, the emission wavelength band of the active core layer 11aa is the 1.55 μm band. The lower optical confinement layer is made of n-type InGaAsP. The upper optical confinement layer is made of p-type InGaAsP. The bandgap wavelengths of the upper and lower optical confinement layer are set to shorter wavelengths than the bandgap wavelength of the active core layer 11aa. In the grating layer 11ab, a sampled grating is formed running in the Z direction in a p-type InGaAsP layer, and the grooves in the grating are filled with InP. The grating in the grating layer 11ab has a fixed grating pitch but is sampled so as to create a reflection response that is substantially periodic as a function of wavelength. Moreover, it is preferable that the bandgap wavelength of the p-type InGaAsP layer in the grating layer 11ab be shorter than the bandgap wavelength of the active core layer 11aa; here, the bandgap wavelength of the p-type InGaAsP layer is 1.2 μm, for example.

The portion of the semiconductor stack 12 within which the grating loaded gain portion 11a is included is configured as follows, for example. The semiconductor stack 12 includes, formed on the n-type InP substrate constituting the substrate B, an n-type semiconductor layer 12a constituted by a buffer layer made of n-type InP that functions as a lower cladding layer. The active core layer 11aa is layered onto the n-type semiconductor layer 12a. Furthermore, a spacer layer 12b made of p-type InP is layered onto the active core layer 11aa. The grating layer 11ab is layered onto the spacer layer 12b. The active core layer 11aa, the spacer layer 12b, and the grating layer 11ab are etched or the like to form a stripe mesa structure having a width (such as 1.8 μm) suitable for single-mode light propagation in the 1.55 μm band. On both sides of the stripe mesa structure (in the left-to-right direction in the figure), buried structures each including a current-blocking structure constituted by a p-type InP buried layer 12c and an n-type InP current-blocking layer 12d are respectively formed. Furthermore, a p-type semiconductor layer 12e is layered onto the grating layer 11ab and the buried structures and includes a p-type InP spacer layer 12ea and a p-type InGaAs contact layer 12eb that is layered onto the spacer layer 12ea and forms the uppermost layer of the semiconductor stack 12. The p-type semiconductor layer 12e is formed spanning at least from directly above the active core layer 11aa to portions of the buried structures on both sides thereof. The semiconductor stack 12 includes a SiN protective film 16 formed covering the semiconductor stack 12. The p-side electrode 13 is made of AuZn, is formed on the contact layer 12eb, and is in ohmic contact with the contact layer 12eb via an opening 16a in the SiN protective film 16. The configuration described above makes it possible to inject current into the active core layer 11aa via the n-side electrode 30 and the p-side electrode 13. Furthermore, the microheater 15 is formed on a SiN protective film 17 formed on the semiconductor stack 12 to insulate the p-side electrode 13 and the microheater 15 and is arranged running parallel to the p-side electrode 13.

Figure 2B:
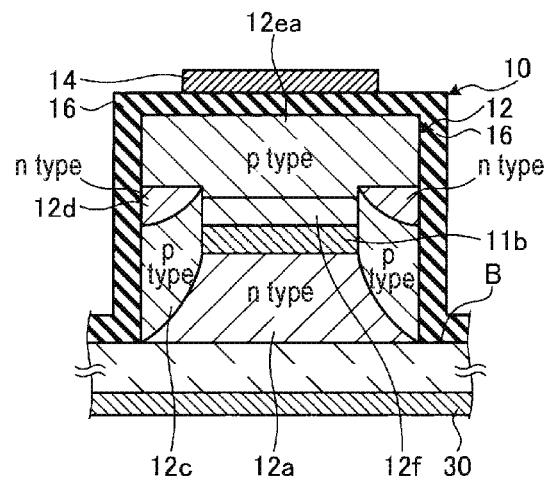
FIG. 2B is a cross-sectional view schematically illustrating the wavelength tunable laser device illustrated in FIG. 1.

Meanwhile, FIG. 2B is a cross-sectional view taken along line B-B in a plane parallel to the XY plane in FIG. 1 and illustrating the portion of the first waveguide 10 within which the phase adjusting portion 11b is included. As illustrated in FIG. 2B, in the cross-sectional structure of the first waveguide 10 that includes the phase adjusting portion 11b, the active core layer 11aa in the structure illustrated in FIG. 2A is replaced with the phase adjusting portion 11b (an InGaAsP optical waveguiding layer), the grating layer 11ab and the spacer layer 12b are replaced with a p-type InP layer 12f, and the contact layer 12eb is removed. In order to reduce optical loss in the phase adjusting portion 11b and effectively confine light therewithin, it is preferable that the bandgap wavelength of the phase adjusting portion 11b be shorter than the bandgap wavelength of the active core layer 11aa; here, the bandgap wavelength of the phase adjusting portion 11b is less than or equal to 1.3 μm, for example.

As described above, the first waveguide 10 has a buried waveguide structure as a first waveguide structure.

Next, returning to FIG. 1, the second waveguide 20 will be described. The second waveguide 20 includes a dual-branch portion 21, two arms 22 and 23, a ring-shaped waveguide 24, and a microheater 25 made of Ti.

The dual-branch portion 21 is constituted by a 1×2 branched waveguide including a 1×2 multimode interference (MMI) waveguide (coupler) 21a, where the two-port side is connected to the two respective arms 22 and 23 and the one-port side is connected to the first waveguide 10 side. The dual-branch portion 21 brings the ends of the two arms 22 and 23 on one side together, thereby optically coupling the arms to the grating layer 11ab.

The arms 22 and 23 both extend in the Z direction and are arranged on either side of the ring-shaped waveguide 24. The arms 22 and 23 are arranged near the ring-shaped waveguide 24 and are both optically coupled to the ring-shaped waveguide 24 with the same coupling coefficient κ. Here, the value of κ is 0.2, for example. Together, the arms 22 and 23 and the ring-shaped waveguide 24 form a ring resonator filter RF1. Moreover, the ring resonator filter RF1 and the dual-branch portion 21 form a reflecting mirror M1. The microheater 25 (a second refractive index changing unit) is ring-shaped and is arranged on a SiN protective film formed covering the ring-shaped waveguide 24.

Figure 2C:
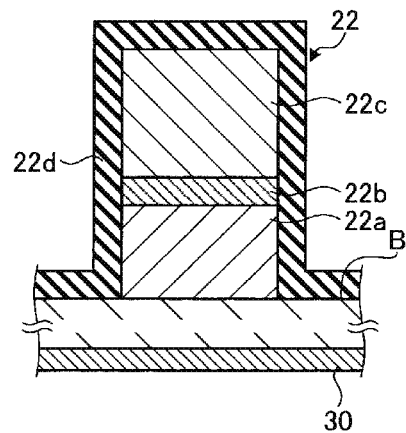
FIG. 2C is a cross-sectional view schematically illustrating the wavelength tunable laser device illustrated in FIG. 1.

FIG. 2C is a cross-sectional view taken along line C-C in a plane parallel to the XY plane in FIG. 1 and illustrating the arm 22 of the second waveguide 20. As illustrated in FIG. 2C, the arm 22 has a high-mesa waveguide structure including an n-type InP lower cladding layer 22a, an InGaAsP optical waveguiding layer 22b, and a p-type InP upper cladding layer 22c layered in that order onto the substrate B. A SiN protective film 22d is formed covering the arm 22. Moreover, the other components of the second waveguide 20 (the dual-branch portion 21, the arm 23, and the ring-shaped waveguide 24) similarly have a high-mesa waveguide structure and are covered by a SiN protective film. In other words, the second waveguide 20 has a second waveguide structure that is different from the first waveguide structure of the first waveguide 10.

The first waveguide 10 and the second waveguide 20 form a laser cavity C1 that includes the grating layer 11ab of the grating loaded gain portion 11a and the reflecting mirror M1, which are optically coupled to one another. The active core layer 11aa (which acts as the gain portion of the grating loaded gain portion 11a) and the phase adjusting portion 11b are arranged within the laser cavity C1.

Figure 3A:
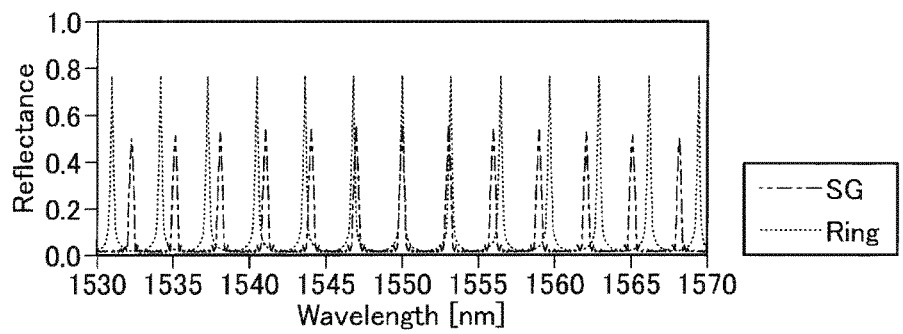
FIG. 3A illustrates a first comb-shaped reflection spectrum and a second comb-shaped reflection spectrum.
Figure 3B:
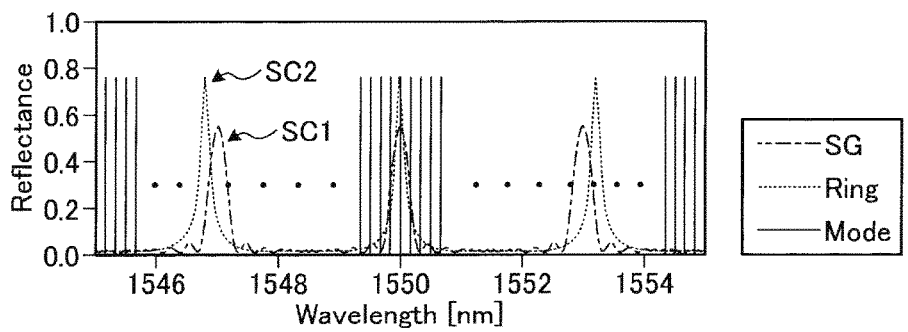
FIG. 3B illustrates a first comb-shaped reflection spectrum, a second comb-shaped reflection spectrum, and cavity modes.

Next, the reflection characteristics of the grating layer 11ab and mirror M1 that includes the ring resonator filter RF1 will be described with reference to FIGS. 3A and 3B. In FIGS. 3A and 3B, the vertical axis represents reflectance. As shown by the "SG" curve in FIG. 3A, the grating layer 11ab creates a first comb-shaped reflection spectrum having substantially periodic reflection characteristics at a substantially prescribed wavelength interval. Meanwhile, as shown by the "Ring" curve in FIG. 3A, the mirror M1 that includes the ring resonator filter RF1 creates a second comb-shaped reflection spectrum having periodic reflection characteristics at a prescribed wavelength interval. FIG. 3B is an enlarged view of the reflection spectrums illustrated in FIG. 3A near 1550 nm. In FIG. 3B, the "Mode" curve represents the cavity modes of the laser cavity C1. These cavity modes exist at least across the 1530 nm to 1570 nm wavelength region illustrated in FIG. 3A. As shown in FIGS. 3A and 3B, the second comb-shaped reflection spectrum has peaks SC2 of a narrower full width at half maximum than the full width at half maximum of spectral components SC1 of the first comb-shaped reflection spectrum and also has substantially periodic reflection characteristics at a wavelength interval different from the wavelength interval of the first comb-shaped reflection spectrum. Note, however, that due to the effects of chromatic dispersion in the refractive indices, the wavelength intervals between these spectral components are not strictly constant.

Next, examples of the characteristics of each comb-shaped reflection spectrum will be described. In the first comb-shaped reflection spectrum, the wavelength interval between peaks (the free spectral range (FSR)) is 373 GHz when expressed in terms of optical frequency, and the full width at half maximum of the peaks is 43 GHz when expressed in terms of optical frequency. Moreover, in the second comb-shaped reflection spectrum, the wavelength interval between peaks (FSR) is 400 GHz when expressed in terms of optical frequency, and the full width at half maximum of the peaks is 25 GHz when expressed in terms of optical frequency. In other words, the full width at half maximum of the peaks in the second comb-shaped reflection spectrum (25 GHz) is less than the full width at half maximum of the peaks in the first comb-shaped reflection spectrum (43 GHz).

Furthermore, the peaks in the second comb-shaped reflection spectrum have a shape that changes rapidly with wavelength, and the second derivative of the reflectance as a function of wavelength takes a positive value in wavelength regions on the shorter wavelength side and longer wavelength side of each peak. The mirror M1 can be configured such that the peaks in the second comb-shaped reflection spectrum have a double exponential distribution (Laplace distribution) shape, for example. Meanwhile, the peaks in the first comb-shaped reflection spectrum have a shape that changes more gradually with wavelength than the peaks in the second comb-shaped reflection spectrum, and the second derivative of the reflectance as a function of wavelength takes a negative value in wavelength regions on the shorter wavelength side and longer wavelength side of each peak. The grating layer 11ab can be configured such that the peaks in the first comb-shaped reflection spectrum have a Gaussian shape, for example.

Figure 4:
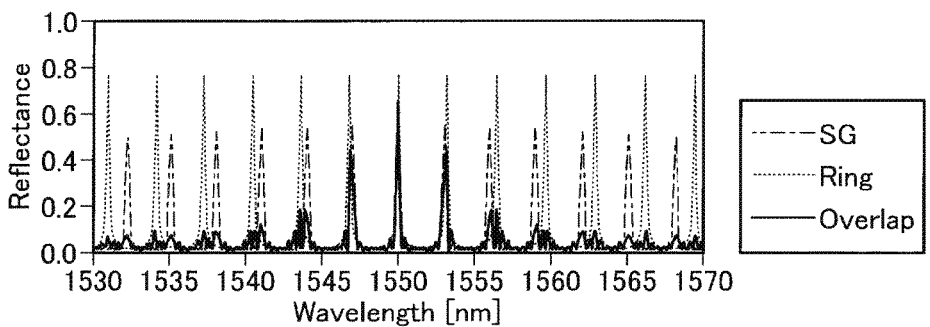
FIG. 4 illustrates a first comb-shaped reflection spectrum, a second comb-shaped reflection spectrum, and the overlap therebetween.

The wavelength tunable laser device 100 is configured such that one of the peaks in the first comb-shaped reflection spectrum and one of the peaks in the second comb-shaped reflection spectrum can be overlapped on the wavelength axis in order to achieve laser oscillation. FIG. 4 illustrates the first comb-shaped reflection spectrum, the second comb-shaped reflection spectrum, and the overlap therebetween. Here, the "Overlap" curve represents the overlap between the spectrums. In the example illustrated in FIG. 4, the overlap is greatest at a wavelength of 1550 nm.

Here, this overlap can be achieved by using at least one of the microheater 15 and the microheater 25 to do at least one of the following: using the microheater 15, apply heat to the grating layer 11ab, thereby changing the refractive index thereof due to the resulting thermooptic effect and shifting the overall first comb-shaped reflection spectrum on the wavelength axis; or using the microheater 25, apply heat to the ring-shaped waveguide 24, thereby changing the refractive index thereof and shifting the overall second comb-shaped reflection spectrum on the wavelength axis.

Meanwhile, the laser cavity C1 of the wavelength tunable laser device 100 has cavity modes, of which several are illustrated in FIG. 3B. In the wavelength tunable laser device 100, the cavity length of the laser cavity C1 is set such that the cavity mode spacing (longitudinal mode spacing) is less than or equal to 25 GHz. In this configuration, the cavity length of the laser cavity C1 is greater than or equal to 1800 μm, which makes it possible to reduce the linewidth of the oscillating laser light.

The wavelength tunable laser device 100 is configured such that when current is injected into the active core layer 11aa via the n-side electrode 30 and the p-side electrode 13, to make the active core layer 11aa emit light, laser oscillation occurs at the wavelength at which a peak of a spectral component in the first comb-shaped reflection spectrum, a peak of a spectral component in the second comb-shaped reflection spectrum, and one of the cavity modes of the laser cavity align (that is, at 1550 nm), thereby resulting in output of laser light L1 (see FIG. 1). Moreover, the wavelengths of the cavity modes of the laser cavity C1 can be fine-tuned by using the microheater 14 to apply heat to the phase adjusting portion 11b, thereby changing the refractive index thereof and shifting the overall cavity mode wavelengths on the wavelength axis. In other words, the phase adjusting portion 11b actively controls the optical path length of the laser cavity C1.

Here, as described above, the second comb-shaped reflection spectrum created by the ring resonator filter RF1 has peaks of a narrower full width at half maximum than the full width at half maximum of the peaks in the first comb-shaped reflection spectrum created by the grating layer 11ab. Therefore, a peak of narrow full width at half maximum in the second comb-shaped reflection spectrum simply has to be aligned within a peak of wider full width at half maximum in the first comb-shaped reflection spectrum, which makes it easy to control the laser oscillation wavelength.

In other words, unlike when two ring resonators are used to configure the cavity and two sharp peaks have to be aligned, here only the peaks in the second comb-shaped reflection spectrum are sharp, which makes it easy to position one of these peaks so as to overlap with a peak in the first comb-shaped reflection spectrum that is less sharp than the peaks in the second comb-shaped reflection spectrum. Moreover, any changes resulting from wavelength offsets are gradual, which makes the laser oscillation wavelength more stable.

Furthermore, as described above, the wavelength tunable laser device 100 is configured such that the spacing between the cavity modes of the laser cavity C1 is less than or equal to 25 GHz, which is less than the full width at half maximum of the spectral components in the first comb-shaped reflection spectrum (43 GHz).

Increasing cavity length in order to reduce the linewidth of laser light reduces the spacing between cavity modes; however, particularly if the cavity mode spacing becomes so narrow that multiple cavity modes can exist within the full width at half maximum of peaks in the first comb-shaped reflection spectrum, it typically becomes difficult to select the cavity mode that causes laser oscillation.

However, in the wavelength tunable laser device 100, even if the cavity mode spacing is this narrow, a peak of narrow full width at half maximum in the second comb-shaped reflection spectrum still has to be aligned within a peak of wider full width at half maximum in the first comb-shaped reflection spectrum, which makes it easy to control selection of the cavity mode. Therefore, the wavelength tunable laser device 100 makes it easy to control selection of the cavity mode even if the laser cavity C1 is configured to have a cavity length long enough that the cavity mode spacing results in two or more cavity modes being included within peaks in the first comb-shaped reflection spectrum.

Furthermore, if the reflectance of peaks in the second comb-shaped reflection spectrum is greater than the reflectance of peaks in the first comb-shaped reflection spectrum as illustrated in FIGS. 3A and 3B, this increases the gain of light reflected by the reflecting mirror M1 and makes it possible to stably select just a single cavity mode via the position of a peak in the second comb-shaped reflection spectrum created by the reflecting mirror M1.

In addition, when the peaks in the second comb-shaped reflection spectrum are configured to have a double exponential distribution shape, and when the peaks in the first comb-shaped reflection spectrum are configured to have a Gaussian shape, it is possible to increase the sharpness of those peaks relative to the peaks in the first comb-shaped reflection spectrum. This causes the peaks in the second comb-shaped reflection spectrum to protrude up higher than the height of the peaks in the first comb-shaped reflection spectrum, thereby making it possible to easily set the reflectance of the peaks in the second comb-shaped reflection spectrum to be greater than the reflectance of the peaks in the first comb-shaped reflection spectrum. This, in turn, makes it possible to easily achieve stable single-mode oscillation.

Figure 5:
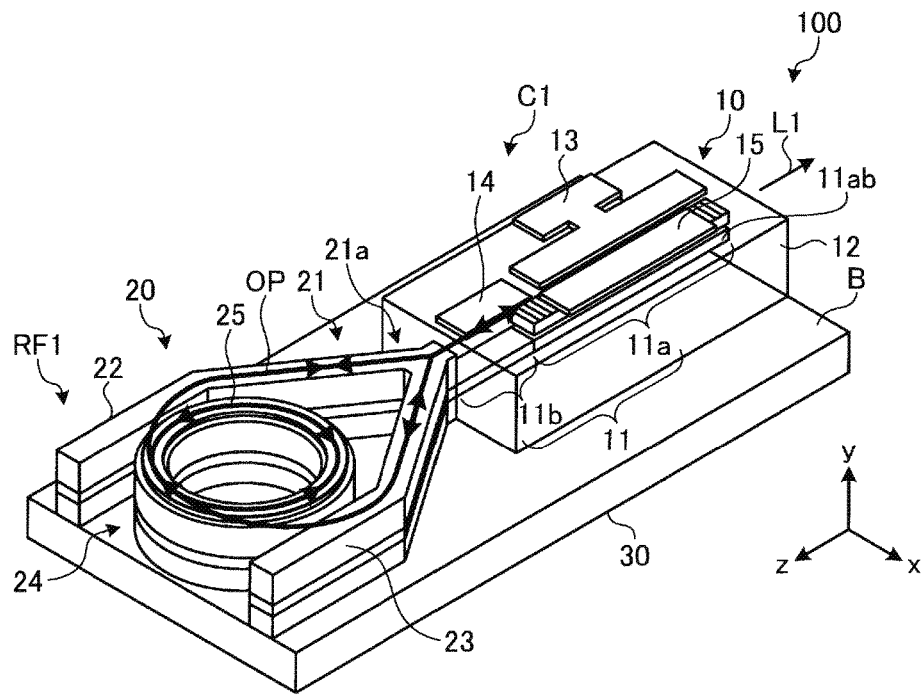
FIG. 5 is a diagram for explaining optical feedback in the wavelength tunable laser device illustrated in FIG. 1.

Moreover, as illustrated by the optical path OP in FIG. 5, the configuration of the wavelength tunable laser device 100 results in optical feedback in the laser cavity C1 following a path going, in order from the grating layer 11ab, to the dual-branch portion 21, one of the arms 22 and 23 of the ring resonator filter RF1, the ring-shaped waveguide 24, the other of the arms 22 and 23, the dual-branch portion 21, and then returning to the grating layer 11ab, where each optical feedback trip includes a circumnavigation of the ring-shaped waveguide 24. Here, the arrows on the optical path OP indicate the direction of travel of the light, and the optical path OP includes both a clockwise optical path and a counterclockwise optical path. In other words, there are two optical paths for optical feedback: the clockwise optical path and the counterclockwise optical path. This increases the optical feedback length, which makes it possible to increase the effective cavity length and thereby makes it possible to reduce the linewidth of the laser light L1.

Next, a method of selecting a laser oscillation wavelength in the wavelength tunable laser device 100 will be described with reference to FIGS. 3A, 3B, 4, and 6. The wavelength tunable laser device 100 takes advantage of the Vernier effect to select the laser oscillation wavelength.

As illustrated in FIGS. 3A, 3B, and 4, the FSRs of the first comb-shaped reflection spectrum and the second comb-shaped reflection spectrum are designed to be slightly different. Moreover, the second comb-shaped reflection spectrum that has the sharper peaks is designed to have the larger FSR, and therefore in comparison to the largest peak in the overlap between the spectrums at 1550 nm, the adjacent peaks in the overlap (such as the overlap near 1547 nm) are relatively small in height. As a result, laser oscillation is inhibited at the wavelengths of peaks in the overlap that are adjacent to the largest peak in the overlap between the spectrums, thereby making it possible to increase the side mode suppression ratio.

The variable wavelength range of the wavelength tunable laser device 100 is determined, as per the Vernier effect, by the least common multiple of the FSRs. When a peak in the first comb-shaped reflection spectrum and a peak in the second comb-shaped reflection spectrum overlap, reflectance is maximized at the wavelength at which the peaks align, and laser oscillation occurs. In other words, the Vernier effect of the grating layer 11ab and the ring resonator filter RF1 determine the approximate laser oscillation wavelength (supermode). More specifically, the laser oscillation wavelength is determined by the overlap between the supermode and the wavelength of the cavity mode defined by the path (cavity length) in the laser cavity C1 going, in order from the grating layer 11ab, to the dual-branch portion 21, one of the arms 22 and 23 of the ring resonator filter RF1, the ring-shaped waveguide 24, the other of the arms 22 and 23, the dual-branch portion 21, and then returning to the grating layer 11ab. In other words, one of the cavity modes of the laser cavity C1 is aligned with the overlapping region between a peak in the first comb-shaped reflection spectrum and a peak in the second comb-shaped reflection spectrum that overlap with one another, and laser oscillation occurs at the wavelength of that matching cavity mode. Therefore, in the wavelength tunable laser device 100, wavelength tuning is implemented by performing a rough adjustment using the microheater 15 on the grating layer 11ab and using the microheater 25 on the ring resonator filter RF1 to respectively tune the first comb-shaped reflection spectrum and the second comb-shaped reflection spectrum, and then performing a more precise adjustment using the microheater 14 on the phase adjusting portion 11b to tune the cavity length.

In the state illustrated in FIGS. 3A and 3B (referred to as "first state"), the first comb-shaped reflection spectrum and the second comb-shaped reflection spectrum overlap most strongly at a wavelength of 1550 nm (the supermode). This first state is a state in which the laser oscillation wavelength is roughly adjusted to approximately 1550 nm. In this first state, tuning the phase adjusting portion 11b to precisely adjust the cavity mode makes it possible to achieve laser oscillation at a wavelength of 1550 nm.

Next, to change the laser oscillation wavelength, heat is applied just to the grating layer 11ab using the microheater 15 in a state in which the tuning of the ring resonator filter RF1 is held fixed. As illustrated by the arrow in FIG. 6, the resulting thermooptic effect increases the refractive index of the grating layer 11ab and shifts the overall reflection spectrum of the grating layer 11ab (the first comb-shaped reflection spectrum) towards the longer wavelength side. As a result, the overlap with the peak near 1550 nm in the reflection spectrum of the ring resonator filter RF1 (the second comb-shaped reflection spectrum) is lost, while a new overlap is achieved with another peak (near 1556 nm) on the longer wavelength side, thereby yielding the second state illustrated in FIG. 6. This achieves a shift to a different supermode. In this state, tuning the phase adjusting portion 11b to precisely adjust the cavity mode makes it possible to achieve laser oscillation near 1556 nm. Moreover, to change the laser oscillation wavelength to a shorter wavelength, the tuning of the grating layer 11ab should be held fixed, and heat should be applied to only the ring resonator filter RF1 using the microheater 25 to shift the overall comb-shaped reflection spectrum of the ring resonator filter RF1 towards the longer wavelength side.

In the wavelength tunable laser device 100 according to Embodiment 1, the wavelength is tuned by using microheaters to take advantage of a thermooptic effect. However, the device may also be configured to tune the wavelength by using current injection to make it possible to take advantage of a carrier plasma effect. In this case, injecting current reduces the refractive index, thereby making it possible to shift the overall comb-shaped reflection spectrums towards the shorter wavelength side and achieve a new supermode by creating overlaps at other spectral components near shorter wavelengths than that at which the previous supermode was achieved.

Figure 6:
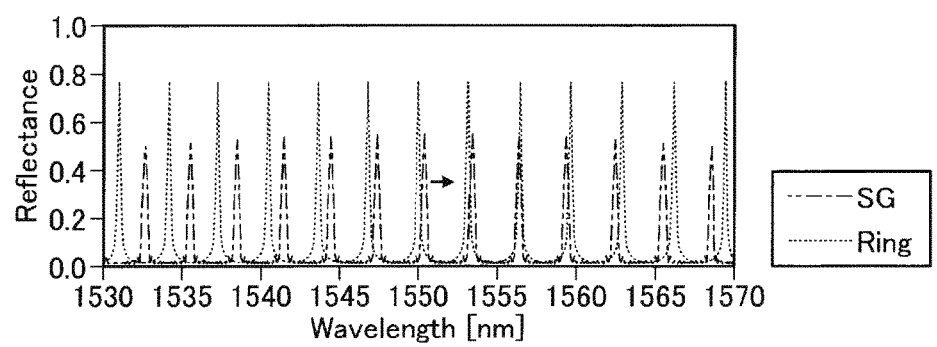
FIG. 6 is a diagram for explaining a method of selecting a laser oscillation wavelength in the wavelength tunable laser device illustrated in FIG. 1.

Furthermore, the reason why reflectance is maximized and laser oscillation occurs at the wavelength at which the peaks in the comb-shaped reflection spectrums created by the grating layer 11ab and the ring resonator filter RF1 align is because, as illustrated in FIG. 6, the first comb-shaped reflection spectrum having the wider full width at half maximum is shifted such that one of the peaks thereof aligns with one of the peaks in the second comb-shaped reflection spectrum having the narrower full width at half maximum.

When tuning to the longer wavelength side, the peaks created by the ring resonator filter RF1 have a narrow full width at half maximum, and thus it is easy to shift the supermode by tuning and shifting the peaks of wider full width at half maximum created by the grating layer 11ab to align with the peaks created by the ring resonator filter RF1.

For the same reason, when tuning to the shorter wavelength side, the tuning of the grating layer 11ab is held fixed and heat is applied to only the ring resonator filter RF1 using the microheater 25 to shift the overall comb-shaped reflection spectrum of the ring resonator filter RF1 towards the longer wavelength side. Here, because the peaks created by the grating layer 11ab have a wide full width at half maximum, it is easy to shift the supermode by tuning and shifting the peaks of narrower full width at half maximum created by the ring resonator filter RF1 to align with the peaks created by the grating layer 11ab.

Furthermore, in the wavelength tunable laser device 100 according to Embodiment 1, after shifting the supermode, the phase adjusting portion 11b is tuned to precisely adjust the cavity mode. Here, if the cavity mode spacing is narrow and is narrower than the full width at half maximum of the peaks in the comb-shaped reflection spectrum of the grating layer 11ab, several cavity modes may potentially exist within a peak of the grating layer 11ab. However, in the wavelength tunable laser device 100, the full width at half maximum of the peaks in the comb-shaped reflection spectrum of the ring resonator filter RF1 is less than the full width at half maximum of the peaks in the comb-shaped reflection spectrum of the grating layer 11ab. Therefore, the probability of several cavity modes competing within a single peak in the comb-shaped reflection spectrum of the ring resonator filter RF1 is low, and it is easy to tune the phase adjusting portion 11b to precisely adjust the cavity mode such that only a single cavity mode aligns with a peak of the ring resonator filter RF1.

The wavelength tunable laser device 100 according to Embodiment 1 as described above thus makes it possible to reduce the linewidth of laser light and achieve stable single-mode oscillation.

Figure 7A:
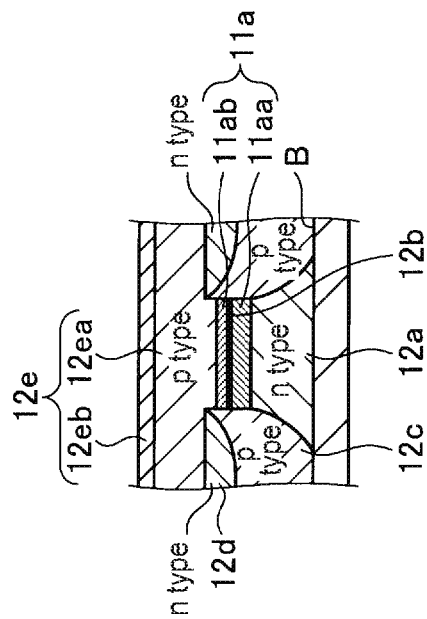
FIG. 7AA is a cross-sectional view illustrating an example of a method of manufacturing the wavelength tunable laser device illustrated in FIG. 1.
Figure 7A:
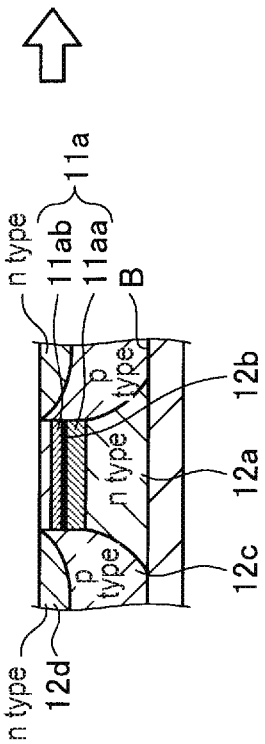
Figure 7A:
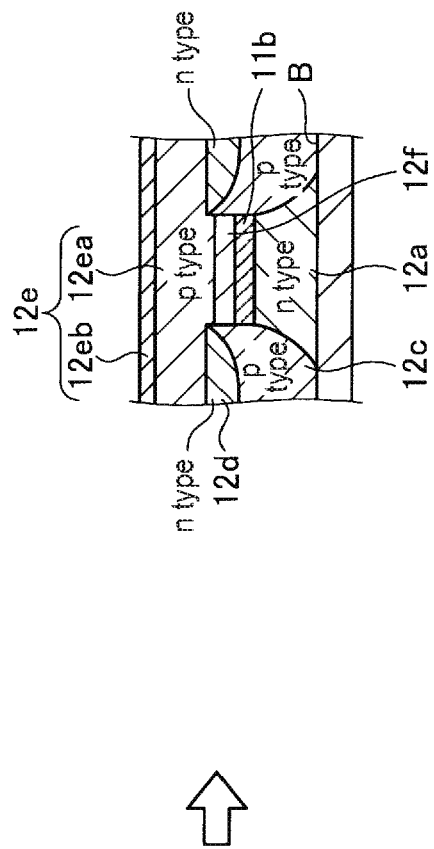
Figure 7A:
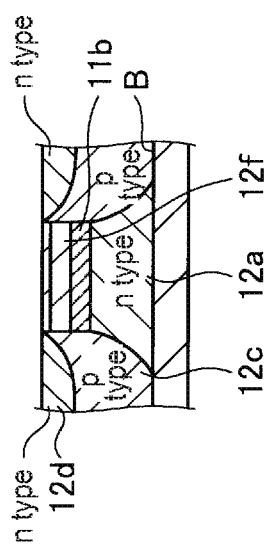
Figure 7A:
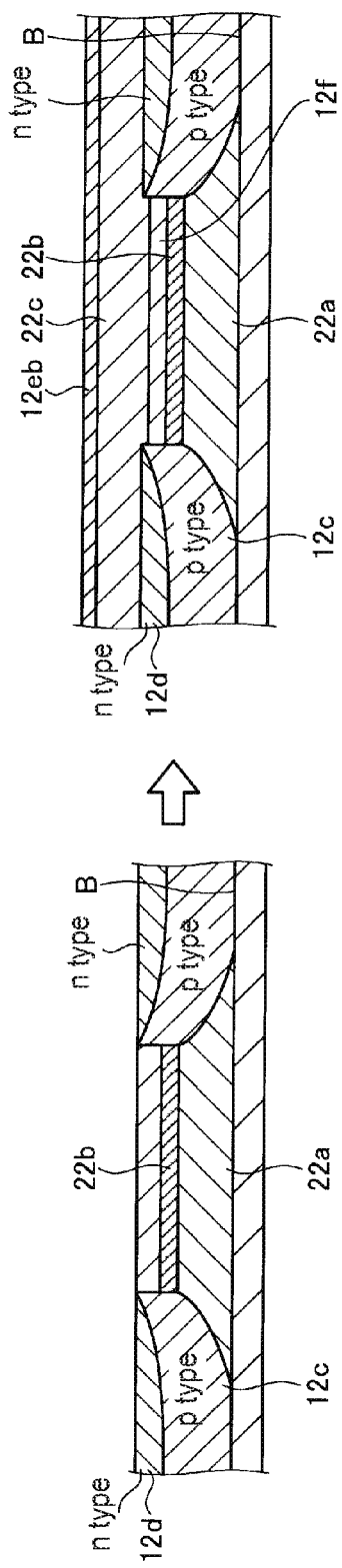
Figure 7B:
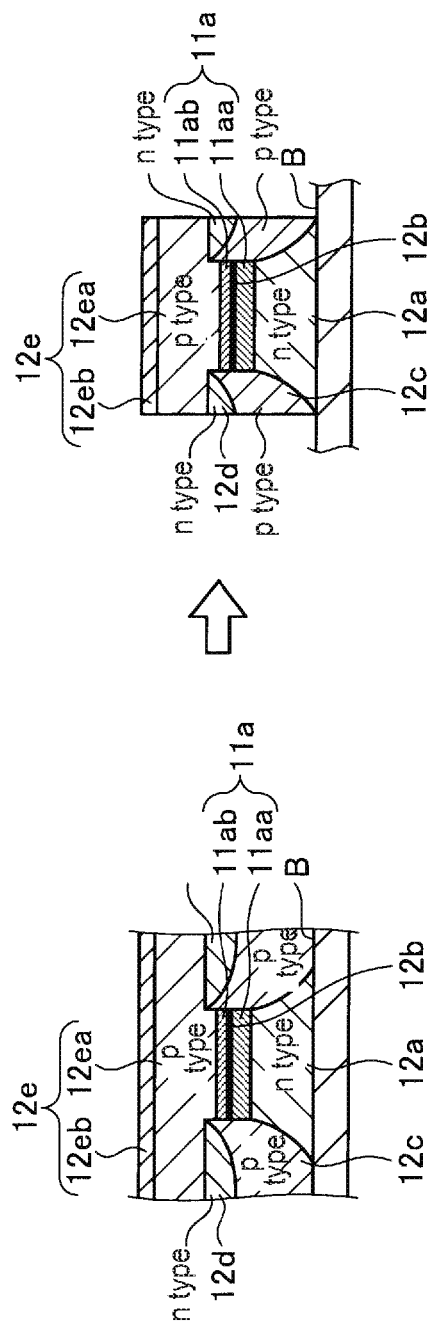
FIG. 7BA is a cross-sectional view illustrating an example of a method of manufacturing the wavelength tunable laser device illustrated in FIG. 1.
Figure 7B:
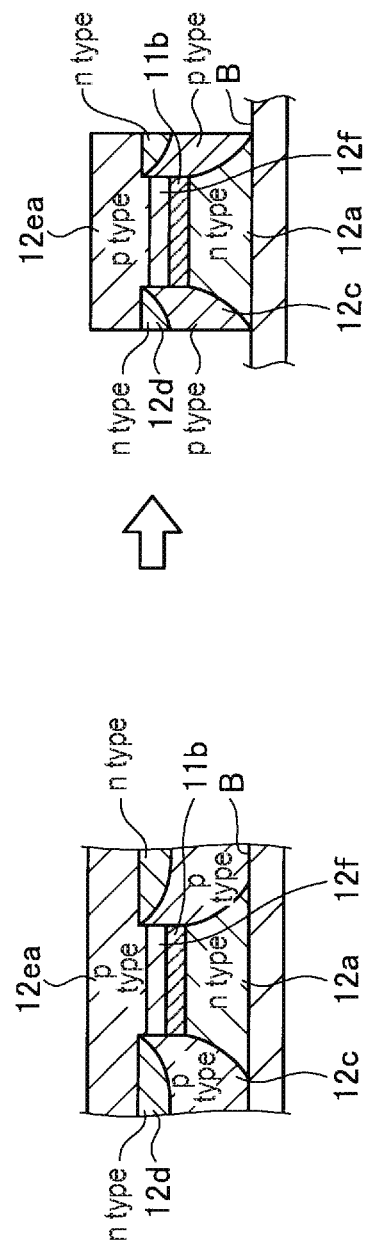
Figure 7C:
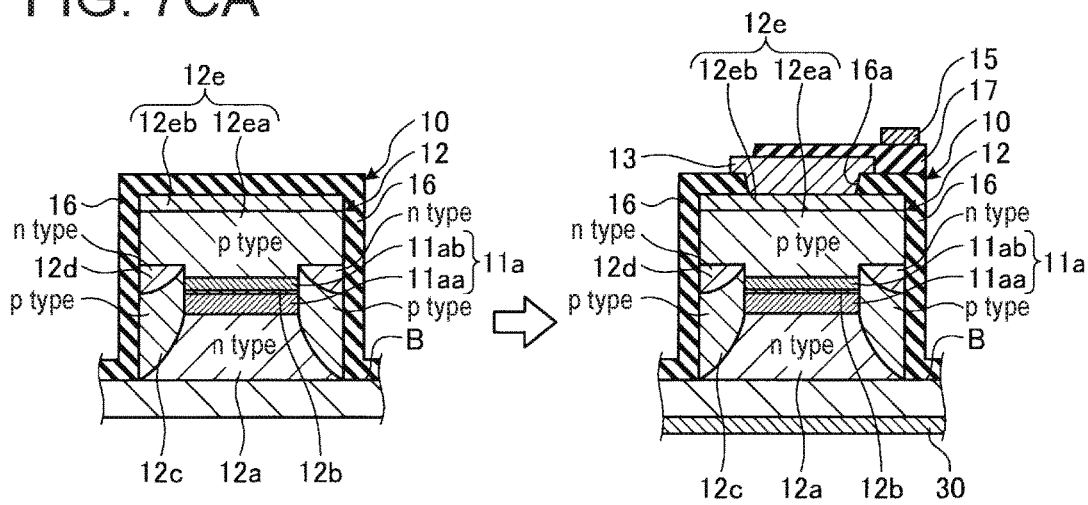
FIG. 7CA is a cross-sectional view illustrating an example of a method of manufacturing the wavelength tunable laser device illustrated in FIG. 1.
Figure 7C:
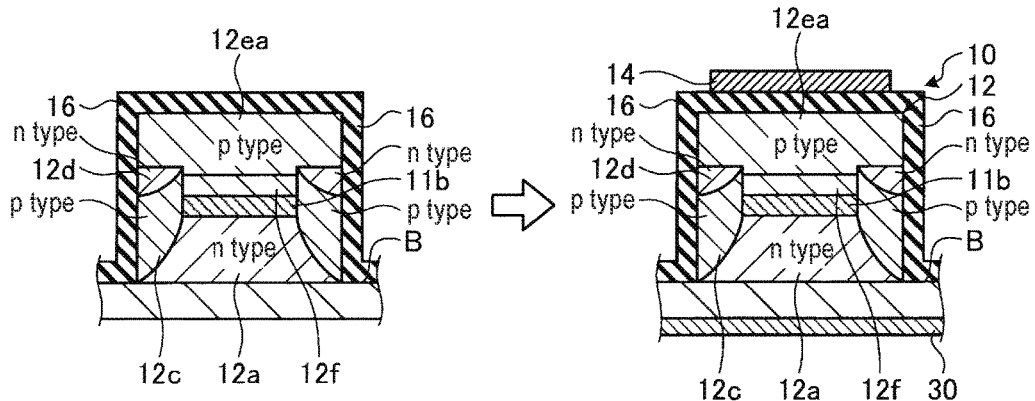
Figure 7C:
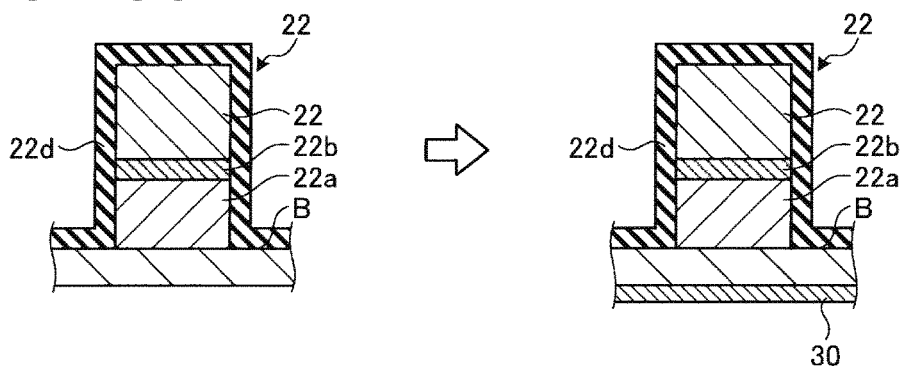

Next, an example of a method of manufacturing the wavelength tunable laser device 100 according to Embodiment 1 will be described with reference to FIGS. 7AA to 7AC, FIGS. 7BA to 7BC, and FIGS. 7CA to 7CC. First, using a metalorganic chemical vapor deposition (MOCVD) process, the n-type semiconductor layer 12a (lower cladding layer 22a), the active core layer 11aa, the spacer layer 12b, the p-type InGaAsP layer that becomes the grating layer 11ab, and the p-type InP layer that becomes a portion of the spacer layer 12ea (upper cladding layer 22c) are sequentially deposited on the n-type InP substrate constituting the substrate B.

Next, after depositing a SiN film over the entire surface, a grating is patterned into the SiN film at the position where the grating loaded gain portion 11a will be formed. Then, using the SiN film as a mask, an etching process is performed to form grating grooves that become a grating in the p-type InGaAsP layer, and then the p-type InGaAsP layer is removed in all positions other than the position at which the grating loaded gain portion 11a will be formed. Next, after removing the SiN film mask, a p-type InP layer is regrown over the entire surface. Then, after depositing a SiN film over the entire surface, the SiN film is patterned to form a pattern having a slightly wider shape than the grating loaded gain portion 11a. Next, using the SiN film as a mask, an etching process is performed to expose the n-type semiconductor layer 12a (lower cladding layer 22a). Then, using the SiN film mask as-is as a selective growth mask, an MOCVD process is performed to form an optical waveguiding layer that becomes the optical waveguiding layers in the phase adjusting portion 11b and the second waveguide 20. Next, after removing the SiN film mask, a new SiN film is deposited and then patterned to form patterns corresponding to the waveguide 11 in the first waveguide 10 and the optical waveguiding layer in the second waveguide 20. Next, using this SiN film as a mask, an etching process is performed to form the mesa structures for the first waveguide 10 and the second waveguide 20 as well as to expose the n-type semiconductor layer 12a (lower cladding layer 22a). Here, the etching process is performed over a wide region including the regions corresponding to the dual-branch portion 21, the arms 22 and 23, and the ring-shaped waveguide 24.

Next, using the SiN film mask from the previous step as a selective growth mask, an MOCVD process is performed to sequentially deposit the p-type InP buried layer 12c and the n-type InP current-blocking layer 12d on the exposed n-type semiconductor layer 12a (lower cladding layer 22a). (See FIGS. 7AA to 7AC. FIG. 7AA is a cross-sectional view of the gain portion taken along line A-A in a plane parallel to the XY plane in FIG. 1, FIG. 7AB is a cross-sectional view of the phase adjusting portion taken along line B-B, and FIG. 7AC is a cross-sectional view of the optical waveguide of the arm taken along line C-C. This also applies to FIGS. 7BA to 7BC and FIGS. 7CA to 7CC below.) Then, as illustrated in FIGS. 7AA to 7AC, after removing the SiN film mask, an MOCVD process is performed to sequentially deposit a p-type InP layer that becomes the remainder of the spacer layer 12ea (upper cladding layer 22c) as well as the contact layer 12eb over the entire surface. Next, as illustrated in FIGS. 7BB and 7BC, the contact layer 12eb on the phase adjusting portion and on the optical waveguide for the arm is removed. Then, after depositing a SiN film over the entire surface, a patterning process is performed to form a pattern corresponding to device-isolating trenches and a waveguide pattern corresponding to the dual-branch portion 21, the arms 22 and 23, and the ring-shaped waveguide 24. Next, as illustrated in FIG. 7BC, using this SiN film as a mask, an etching process is performed to form the trench structures and the high-mesa waveguide for the second waveguide 20. This etching process is performed down to a depth reaching the substrate B, for example. Then, as illustrated in FIGS. 7CA to 7CC, after removing the SiN film mask, a new SiN film is deposited over the entire surface and an opening is formed in a portion corresponding to the grating loaded gain portion 11a. Moreover, as illustrated in FIG. 7CA, using the SiN film as a protective film, a conductive film containing AuZn is deposited over the entire surface, and then this conductive film is patterned to form the p-side electrode 13. Meanwhile, the n-side electrode 30 that contains AuGeNi is formed on the rear surface of the substrate. Next, after forming the SiN protective film 17, the microheaters 14, 15, and 25 for changing refractive indices and made of Ti, for example, are formed. Finally, the substrate is cleaved into bar shapes on which a plurality of the wavelength tunable laser devices 100 are arranged, the end face on the grating loaded gain portion 11a side of the first waveguide 10 and the end face where the through ports of the arms 22 and 23 are present are coated with an antireflective film, and the wavelength tunable laser devices 100 are separated into discrete devices, thereby completing the wavelength tunable laser devices 100.

Figure 8:
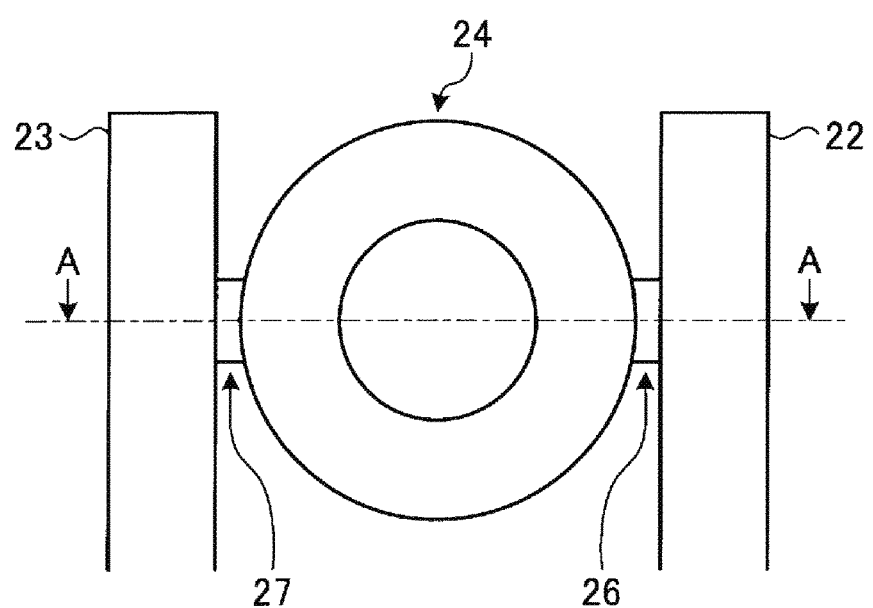
FIG. 8 is a diagram for explaining waveguides that optically couple a ring-shaped waveguide to two arms in the wavelength tunable laser device illustrated in FIG. 1.

In the wavelength tunable laser device 100 according to Embodiment 1 as described above, the arms 22 and 23 are optically coupled to the ring-shaped waveguide 24 by being arranged near the ring-shaped waveguide 24. However, as illustrated in FIG. 8, the arms 22 and 23 may alternatively be optically coupled to the ring-shaped waveguide 24 via waveguides 26 and 27.

Figure 9A:
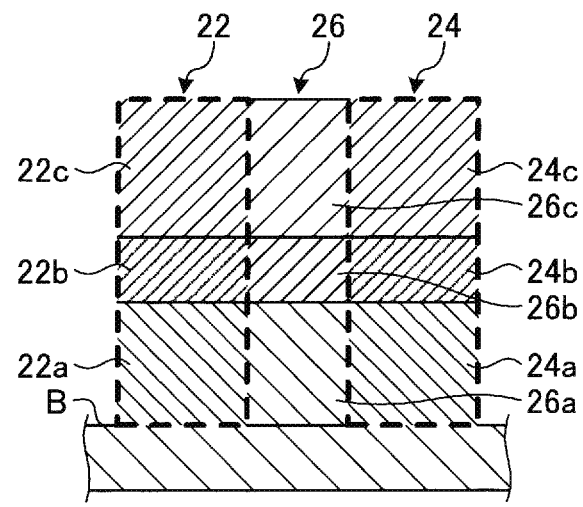
FIG. 9A is a diagram for explaining a structure for the waveguides.

FIG. 9A is a diagram for explaining the structure of the waveguides. FIG. 9A illustrates a portion of a cross section taken along line A-A in FIG. 8. As described above, the arm 22 has a high-mesa waveguide structure including the n-type InP lower cladding layer 22a, the InGaAsP optical waveguiding layer 22b, and the p-type InP upper cladding layer 22c that are layered in that order onto the substrate B. Similarly, the arm 23 has a high-mesa waveguide structure including an n-type InP lower cladding layer 23a, an InGaAsP optical waveguiding layer 23b, and a p-type InP upper cladding layer 23c layered in that order onto the substrate B. Furthermore, the waveguide 26 is a multimode interference (MMI) waveguide having a high-mesa waveguide structure including an n-type InP lower cladding layer 26a, an InGaAsP optical waveguiding layer 26b, and a p-type InP upper cladding layer 26c layered in that order onto the substrate B. Moreover, the waveguide 27 is also an MMI waveguide and has the same high-mesa waveguide structure as the waveguide 26.

Optically coupling the arms 22 and 23 to the ring-shaped waveguide 24 via the waveguides 26 and 27 in this manner makes it possible to optically couple the arms 22 and 23 to the ring-shaped waveguide 24 more easily and also makes it possible to more easily adjust the coupling coefficient κ.

Figure 9B:
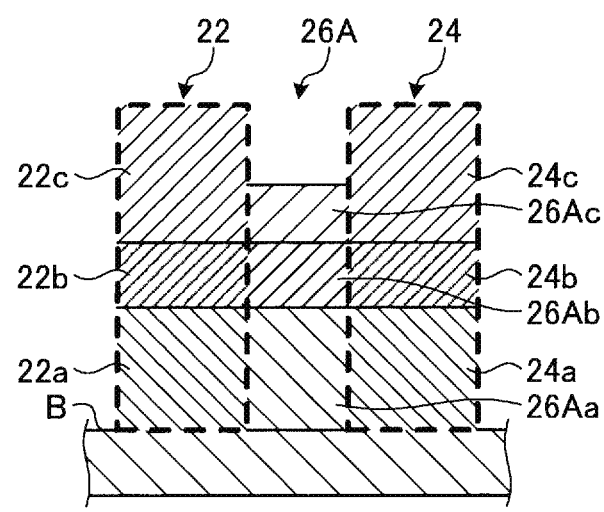
FIG. 9B is a diagram for explaining a structure for the waveguides.

The waveguides that optically couple the arms 22 and 23 to the ring-shaped waveguide 24 are not limited to being MMI waveguides and may alternatively be directionally coupling waveguides 26A of the type illustrated in FIG. 9B, for example. The waveguide 26A still has a high-mesa waveguide structure including an n-type InP lower cladding layer 26Aa, an InGaAsP optical waveguiding layer 26Ab, and a p-type InP upper cladding layer 26Ac layered in that order onto the substrate B, but here the upper cladding layer 26Ac is formed to be thinner than the upper cladding layer 26c of the waveguide 26, and therefore the waveguide 26A functions as a directionally coupling waveguide.

Moreover, one difference between directionally coupling waveguides and MMI waveguides is that changes in the coupling coefficient between the arms and the ring-shaped waveguide as a function of changes in the width of the waveguides running along the arms are smaller in directionally coupling waveguides than in MMI waveguides. Therefore, when MMI waveguides are used to form the waveguides, changing the width of the waveguides running along the arms makes it possible to change the coupling coefficient more significantly.

Furthermore, although in the wavelength tunable laser device 100 according to Embodiment 1 as described above, the first waveguide 10 has a buried waveguide structure as the first waveguide structure, the first waveguide may alternatively have a ridge waveguide structure as the first waveguide structure.

Figure 10:
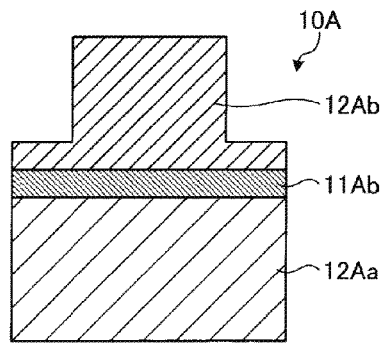
FIG. 10 is a diagram for explaining an example of a first waveguide that has a ridge waveguide structure.

FIG. 10 is a diagram for explaining an example of a first waveguide that has a ridge waveguide structure. FIG. 10 is a cross-sectional view taken along the XY plane in FIG. 1 and illustrating the portion of a first waveguide 10A within which a phase adjusting portion 11Ab is included. The portion of the first waveguide 10A that includes the phase adjusting portion 11Ab has a structure in which a p-type InP lower cladding layer 12Aa, the phase adjusting portion 11Ab (an InGaAsP optical waveguiding layer), and an n-type InP upper ridge cladding layer 12Ab are layered together in that order. Thus, the first waveguide may have this ridge waveguide structure.

Embodiment 2

Figure 11:
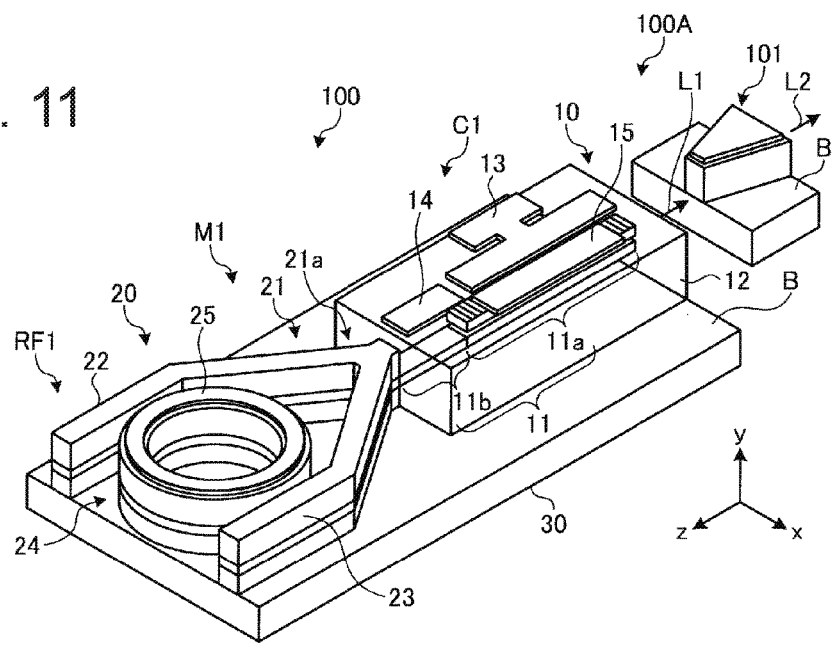
FIG. 11 is a perspective view schematically illustrating a wavelength tunable laser device according to Embodiment 2.

FIG. 11 is a perspective view schematically illustrating a wavelength tunable laser device according to Embodiment 2. As illustrated in FIG. 11, a wavelength tunable laser device 100A according to Embodiment 2 includes the wavelength tunable laser device 100 according to Embodiment 1 as illustrated in FIG. 1 as well as a semiconductor optical amplifier (SOA) 101 formed on a substrate B. The SOA 101 has a buried waveguide structure including an active core layer of the same material and structure as in the first waveguide. Here, however, no grating layer is included.

The wavelength tunable laser device 100 and the SOA 101 are optically coupled via a spatially coupled optical system (not illustrated in the figure). The laser light L1 output from the wavelength tunable laser device 100 is input to the SOA 101. The SOA 101 optically amplifies the laser light L1 and outputs the resulting light as laser light L2. The wavelength tunable laser device 100A according to Embodiment 2 reduces the linewidth of laser light and achieves stable single-mode oscillation similar to in the wavelength tunable laser device 100 according to Embodiment 1 and also includes the SOA 101, thereby making it possible to output higher power laser light.

Moreover, although in the wavelength tunable laser device 100A according to Embodiment 2 the wavelength tunable laser device 100 and the SOA 101 are optically coupled via a spatially coupled optical system (not illustrated in the figure), the wavelength tunable laser device 100 and the SOA 101 may alternatively be formed monolithically on the same substrate B.

Embodiment 3

Next, Embodiment 3 will be described. Embodiment 3 is different from Embodiments 1 and 2 in that the second waveguide is a silicon (Si) photonic waveguide, for example.

Figure 12A:
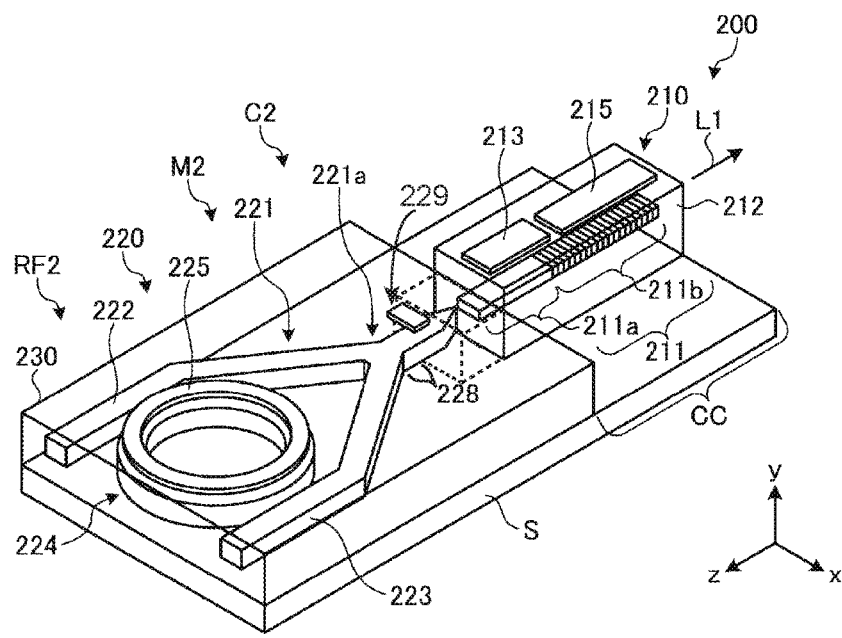
FIG. 12A is a perspective view schematically illustrating a wavelength tunable laser device according to Embodiment 3.
Figure 12B:
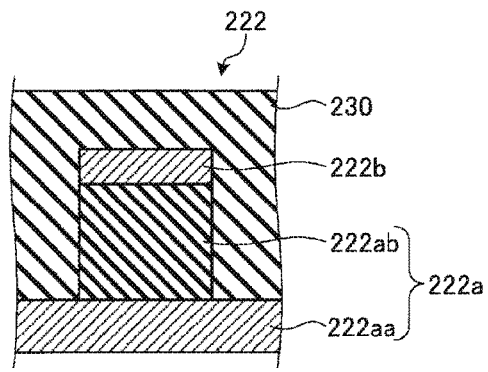
FIG. 12B is a cross-sectional view schematically illustrating the wavelength tunable laser device according to Embodiment 3.

FIGS. 12A and 12B schematically illustrate a wavelength tunable laser device according to Embodiment 3. FIG. 12A is a perspective view, and FIG. 12B is a cross-sectional view that will be described later. A wavelength tunable laser device 200 is configured to achieve laser oscillation in the 1.55 μm band and output the resulting laser light. The wavelength tunable laser device 200 includes a first waveguide 210 and a second waveguide 220.

The first waveguide 210 includes a waveguide 211, a semiconductor stack 212, an n-side electrode 213, and a microheater 215. The waveguide 211 is formed extending in the Z direction within the semiconductor stack 212. A gain portion 211a and a DBR grating layer 211b are arranged within the first waveguide 210. The semiconductor stack 212 is formed by stacking semiconductor layers and functions as cladding or the like for the waveguide 211, for example. The gain portion 211a includes a multiple quantum well structure made of the same material as the active core layer 11aa in Embodiment 1, as well as optical confinement layers. Moreover, the grating layer 211b is constituted by a sampled grating made of the same material as the grating layer 11ab in Embodiment 1. Furthermore, the portion of the semiconductor stack 212 that includes the gain portion 211a is made of the same materials and has the same structure as the portion of the semiconductor stack 12 that includes the grating loaded gain portion 11a in Embodiment 1 except in that the grating layer 11ab is replaced with a p-type InP layer and in that in the layered structure sandwiching the gain portion 211a in the Y direction, the positions of the p-type semiconductor layer and the n-type semiconductor layer are reversed. In addition, the portion of the semiconductor stack 212 that includes the grating layer 211b is made of the same materials and has the same structure as the portion of the semiconductor stack 12 that includes the phase adjusting portion 11b in Embodiment 1 except in that in the layered structure sandwiching the phase adjusting portion 211b in the Y direction, the positions of the p-type semiconductor layer and the n-type semiconductor layer are reversed. The first waveguide 210 has a buried waveguide structure as a first waveguide structure.

The n-side electrode 213 is arranged on the semiconductor stack 212 and is aligned with the gain portion 211a. Moreover, the semiconductor stack 212 includes a SiN protective film, and the n-side electrode 213 contacts the semiconductor stack 212 via an opening formed in the SiN protective film. The microheater 215 (a first refractive index changing unit) is arranged on the SiN protective film of the semiconductor stack 212 and is aligned with the grating layer 211b. Furthermore, a p-side electrode (not illustrated in the figure) is formed on the surface of the semiconductor stack 212 opposite to the surface on which the n-side electrode 213 is formed.

Next, the second waveguide 220 will be described. The second waveguide 220 is formed in a silicon on insulator (SOI) substrate S. The second waveguide 220 includes a dual-branch portion 221, arms 222 and 223, a ring-shaped waveguide 224, microheaters 225 and 229, a phase adjusting portion 228, and an overcladding layer 230 made of $SiO_2$.

The dual-branch portion 221 is constituted by a 1×2 branched waveguide including a 1×2 MMI (Multi-Mode Interference) waveguide 221a, where the two-port side is connected to the two respective arms 222 and 223 and the one-port side is connected via the phase adjusting portion 228 to the first waveguide 210 side. The dual-branch portion 221 brings the ends of the two arms 222 and 223 on one side together, thereby optically coupling the arms to the grating layer 211b. A tapered portion that becomes narrower in width going towards the first waveguide 210 is formed in the first waveguide 210 side of the phase adjusting portion 228. An overcladding layer made of a material such as SiN with a higher refractive index than $SiO_2$ is formed around the periphery of the tapered portion, thereby forming a spot size converter structure.

The arms 222 and 223 both extend in the Z direction and are arranged on either side of the ring-shaped waveguide 224. The arms 222 and 223 are arranged near the ring-shaped waveguide 224 and are both optically coupled to the ring-shaped waveguide 224 with the same coupling coefficient κ. Together, the arms 222 and 223 and the ring-shaped waveguide 224 form a ring resonator filter RF2. Moreover, the ring resonator filter RF2 and the dual-branch portion 221 form a reflecting mirror M2. The microheater 225 (a second refractive index changing unit) is ring-shaped and is arranged directly above the ring-shaped waveguide 224 on the overcladding layer 230. Moreover, the microheater 229 is arranged on the overcladding layer 230 and is aligned with the phase adjusting portion 228.

FIG. 12B is a cross-sectional view taken along a plane parallel to the XY plane in FIG. 12A and illustrating the arm 222 of the second waveguide 220. As illustrated in FIG. 12B, the arm 222 has a high-mesa waveguide structure including a lower layer 222a constituted by a supporting layer 222*aa* made of the Si supporting substrate of the SOI substrate S and a buried oxide (BOX) layer 222*ab* made of SiO$_2$ and arranged on the supporting layer 222*aa*, as well as a device layer 222*b* made of Si and arranged on the BOX layer 222*ab*. The device layer 222*b* functions as an optical waveguiding layer, and the high-mesa waveguide structure is covered by the overcladding layer 230. Moreover, the other components of the second waveguide 220 (the dual-branch portion 221, the arm 223, the ring-shaped waveguide 224, and the phase adjusting portion 228) similarly have a high-mesa waveguide structure. In other words, the second waveguide 220 has a second waveguide structure that is different from the first waveguide structure of the first waveguide 210.

Moreover, the first waveguide 210 is separately manufactured as a gain chip using a well-known method and is mounted in a recess CC formed by partially removing the device layer, the BOX layer, and the supporting substrate of the SOI substrate S in which the second waveguide 220 is formed. Here, the gain portion 211*a* of the first waveguide 210 and the phase adjusting portion 228 of the second waveguide 220 are connected via a butt joint.

The first waveguide 210 and the second waveguide 220 form a laser cavity C2 that includes the grating layer 211*b* and the reflecting mirror M2, which are optically coupled to one another. The gain portion 211*a* and the phase adjusting portion 228 are arranged within the laser cavity C2.

In the wavelength tunable laser device 200, similar to in Embodiments 1 and 2, the grating layer 211*b* creates a first comb-shaped reflection spectrum having substantially periodic reflection characteristics at a substantially prescribed wavelength interval. Moreover, the ring resonator filter RF2 creates a second comb-shaped reflection spectrum that has peaks of a narrower full width at half maximum than the full width at half maximum of spectral components of the first comb-shaped reflection spectrum and also has substantially periodic reflection characteristics at a wavelength interval different from the wavelength interval of the first comb-shaped reflection spectrum. Furthermore, laser oscillation occurs at the wavelength at which a peak in the first comb-shaped reflection spectrum, a peak in the second comb-shaped reflection spectrum, and one of the cavity modes of the laser cavity C2 align. In addition, the spacing between cavity modes of the laser cavity C2 is less than the full width at half maximum of the spectral components in the first comb-shaped reflection spectrum. Moreover, optical feedback in the laser cavity C2 follows a path going, in order, from the grating layer 211*b* to the dual-branch portion 221, one of the arms 222 and 223 of the ring resonator filter RF2, the ring-shaped waveguide 224, the other of the arms 222 and 223, the dual-branch portion 221, and then returning to the grating layer 211*b*, where each optical feedback trip includes a circumnavigation of the ring-shaped waveguide 224. Therefore, the wavelength tunable laser device 200 according to Embodiment 3 increases the optical feedback length, thereby making it possible to reduce the effective linewidth of laser light. Moreover, similar to in Embodiments 1 and 2 stable single-mode oscillation can be achieved.

Furthermore, similar to in Embodiments 1 and 2, in the wavelength tunable laser device 200, laser oscillation wavelength tuning is implemented by performing a rough adjustment using the microheater 215 on the grating layer 211*b* and using the microheater 225 on the ring resonator filter RF2 to respectively tune the first comb-shaped reflection spectrum and the second comb-shaped reflection spectrum, and then performing a more precise adjustment using the microheater 229 on the phase adjusting portion 228 to tune the cavity length.

Similar to Embodiments 1 and 2, the wavelength tunable laser device 200 according to Embodiment 3 makes it possible to reduce the linewidth of laser light and achieve stable single-mode oscillation. Furthermore, in the wavelength tunable laser device 200, the second waveguide 220 is a Si photonic waveguide. Si photonic waveguides exhibit strong waveguide confinement and can therefore be curved strongly. This makes it possible to easily form the ring-shaped waveguide 224 to have a small diameter. This, in turn, makes it possible for the ring-shaped waveguide 224 to have a large FSR, which improves the degree of freedom in designing the ring resonator filter RF2. Therefore, the wavelength tunable laser device 200 has a small, compact footprint and makes it possible to output laser light with a high side mode suppression ratio.

Next, an example of a method of manufacturing the wavelength tunable laser device 200 according to Embodiment 3 will be described. First, using a photolithography process, a Si waveguide pattern for the second waveguide 220 is transferred onto the SOI substrate. More specifically, the device layer and the BOX layer are etched using an HBr gas, for example, to form a channel waveguide structure. Here, a dry thermal oxidation process may also be performed to reduce the roughness of the side faces of the waveguide created in the etching process. Next, a SiN layer is deposited over the entire surface, and a photolithography and etching process is performed to form the overcladding layer made of SiN on a portion corresponding to the spot size converter structure described above. Then, a SiO$_2$ layer that becomes the overcladding layer 230 is deposited over the entire surface.

Next, the microheaters 225 and 229 made of Ti, for example, are respectively formed on the ring-shaped waveguide 224 and the phase adjusting portion 228. Then, an etching process is performed to partially remove the overcladding layer 230 and the supporting substrate in the portion corresponding to the recess CC in which the first waveguide 210 (the separately manufactured gain chip) will be mounted, thereby forming the recess CC. The first waveguide 210 is then mounted in this portion using a flip chip bonding process. This completes the wavelength tunable laser device 200.

Note that the first waveguide 210 (the gain chip) is not limited to the example described above. For example, the first waveguide may have a quantum well structure or a quantum dot structure on an InP or GaAs substrate. Here, III-V compound semiconductors such as InGaAs, InGaAsN, AlInGaAs, or InGaAs can be used as the compound semiconductor material for such a quantum well structure. Moreover, III-V compound semiconductors such as InAs or InGaAs can be used as the compound semiconductor material for such a quantum dot structure.

Embodiment 4

Next, Embodiment 4 will be described. Embodiment 4 is similar to Embodiment 3 in that the second waveguide is a silicon (Si) photonic waveguide but different from Embodiment 3 in that the second waveguide includes a grating and in that the first waveguide includes a U-shaped waveguide, for example.

Figure 13:
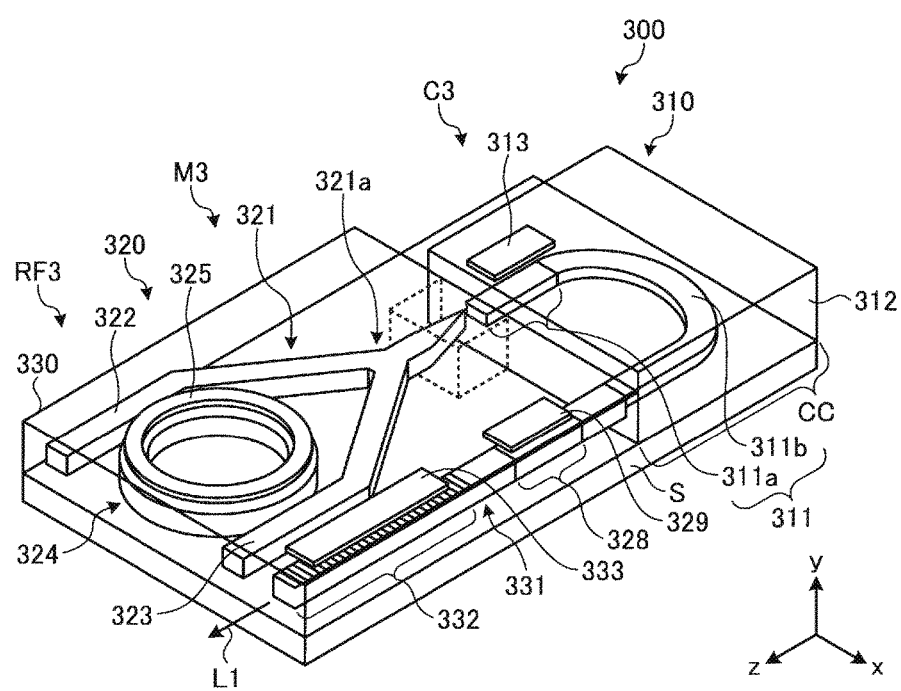
FIG. 13 is a perspective view schematically illustrating a wavelength tunable laser device according to Embodiment 4.

FIG. 13 is a perspective view schematically illustrating a wavelength tunable laser device according to Embodiment 4. A wavelength tunable laser device 300 is configured to achieve laser oscillation in the 1.55 μm band and output the resulting laser light. The wavelength tunable laser device 300 includes a first waveguide 310 and a second waveguide 320.

The first waveguide 310 includes a waveguide 311, a semiconductor stack 312, and an n-side electrode 313. The waveguide 311 is formed in a U-shape within the semiconductor stack 312, with a portion of the U-shape extending in the Z direction. A gain portion 311a and an optical waveguiding layer 311b are arranged within the first waveguide 310. The semiconductor stack 312 is formed by stacking semiconductor layers and functions as cladding or the like for the waveguide 311, for example. The gain portion 311a extends in the Z direction and includes a multiple quantum well structure made of the same material as the active core layer 11aa in Embodiment 1. Moreover, the optical waveguiding layer 311b is made of the same material as the phase adjusting portion 11b in Embodiment 1 and forms a U-shape together with the gain portion 311a. Furthermore, the portion of the semiconductor stack 312 that includes the gain portion 311a is made of the same materials and has the same structure as the portion of the semiconductor stack 12 that includes the grating loaded gain portion 11a in Embodiment 1 except in that the grating layer 11ab is replaced with a p-type InP layer and in that in the layered structure sandwiching the gain portion 311a in the Y direction, the positions of the p-type semiconductor layer and the n-type semiconductor layer are reversed. In addition, the portion of the semiconductor stack 312 that includes the optical waveguiding layer 311b is made of the same materials and has the same structure as the portion of the semiconductor stack 12 that includes the phase adjusting portion 11b in Embodiment 1 except in that in the layered structure sandwiching the optical waveguiding layer 311b in the Y direction, the positions of the p-type semiconductor layer and the n-type semiconductor layer are reversed. The first waveguide 310 has a buried waveguide structure as a first waveguide structure.

The n-side electrode 313 is arranged on the semiconductor stack 312 and is aligned with the gain portion 311a. Moreover, the semiconductor stack 312 includes a SiN protective film formed covering the semiconductor stack 312, and the n-side electrode 313 contacts the semiconductor stack 312 via an opening formed in the SiN protective film. Furthermore, a p-side electrode (not illustrated in the figure) is formed on the surface of the semiconductor stack 312 opposite to the surface on which the n-side electrode 313 is formed.

Next, the second waveguide 320 will be described. The second waveguide 320 is formed in an SOI substrate. The second waveguide 320 includes a dual-branch portion 321; arms 322 and 323; a ring-shaped waveguide 324; microheaters 325, 329, and 333; a phase adjusting portion 328; an overcladding layer 330 made of $SiO_2$; a waveguide 331; and a grating 332.

The dual-branch portion 321 is constituted by a 1×2 branched waveguide including a 1×2 MMI waveguide 321a, where the two-port side is connected to the two respective arms 322 and 323 and the one-port side is connected to the gain portion 311a side of the first waveguide 310. The dual-branch portion 321 brings the ends of the two arms 322 and 323 on one side together, thereby optically coupling the arms to the grating 332. A tapered portion that becomes narrower in width going towards the first waveguide 310 is formed in the one-port side of the dual-branch portion 321. An overcladding layer made of a material such as SiN with a higher refractive index than $SiO_2$ is formed around the periphery of the tapered portion, thereby forming a spot size converter structure.

The arms 322 and 323 both extend in the Z direction and are arranged on either side of the ring-shaped waveguide 324. The arms 322 and 323 are arranged near the ring-shaped waveguide 324 and are both optically coupled to the ring-shaped waveguide 324 with the same coupling coefficient κ. Together, the arms 322 and 323 and the ring-shaped waveguide 324 form a ring resonator filter RF3. Moreover, the ring resonator filter RF3 and the dual-branch portion 321 form a reflecting mirror M3. The microheater 325 (a second refractive index changing unit) is ring-shaped and is arranged directly above the ring-shaped waveguide 324 on the overcladding layer 330.

The waveguide 331 extends in the Z direction, with one end connected to the optical waveguiding layer 311b side of the first waveguide 310 and the other end connected to the grating 332. Moreover, the phase adjusting portion 328 is arranged midway through the waveguide 331. The microheater 329 is arranged on the overcladding layer 330 and is aligned with the phase adjusting portion 328. The microheater 333 (a first refractive index changing unit) is arranged on the overcladding layer 330 and is aligned with the grating 332.

Here, the components of the second waveguide 320 (the dual-branch portion 321, the arms 322 and 323, the ring-shaped waveguide 324, the phase adjusting portion 328, the waveguide 331, and the grating 332) have the same high-mesa waveguide structure as in Embodiment 3 as illustrated in FIG. 12B. In other words, the second waveguide 320 has a second waveguide structure that is different from the first waveguide structure of the first waveguide 310. Moreover, in the grating layer 332, a sampled grating is formed running in the Z direction in a device layer that functions as an optical waveguiding layer, and the grooves in the grating are filled with the $SiO_2$ material of the overcladding layer 330.

Furthermore, the first waveguide 310 is separately manufactured as a gain chip using a well-known method and is mounted in a recess CC formed by partially removing the device layer, a BOX layer, and a supporting substrate of the SOI substrate in which the second waveguide 320 is formed. Here, the gain portion 311a of the first waveguide 310 and the one-port side of the dual-branch portion 321 of the second waveguide 320 are connected via a butt joint, and the optical waveguiding layer 311b of the first waveguide 310 and the waveguide 331 of the second waveguide 320 are connected via a butt joint. Moreover, similar to in Embodiment 3, it is preferable that tapered portions that become narrower in width going towards the first waveguide 310 be formed in the one-port side of the dual-branch portion 321 of the second waveguide 320 and in the waveguide 331 of the second waveguide 320, and also that overcladding layers made of SiN, for example, be formed around the peripheries of those tapered portions to form spot size converter structures.

The first waveguide 310 and the second waveguide 320 form a laser cavity C3 that includes the grating 332 and the reflecting mirror M3, which are optically coupled to one another. The gain portion 311a and the phase adjusting portion 328 are arranged within the laser cavity C3.

In the wavelength tunable laser device 300, similar to in Embodiments 1 to 3, the grating 332 creates a first comb-shaped reflection spectrum having substantially periodic reflection characteristics at a substantially prescribed wavelength interval. Moreover, the ring resonator filter RF3 creates a second comb-shaped reflection spectrum that has peaks of a narrower full width at half maximum than the full width at half maximum of peaks in the first comb-shaped reflection spectrum and also has substantially periodic reflection characteristics at a wavelength interval different from the wavelength interval of the first comb-shaped reflection spectrum. Furthermore, laser oscillation occurs at the wavelength at which a peak in the first comb-shaped reflection spectrum, a peak in the second comb-shaped reflection spectrum, and one of the cavity modes of the laser cavity C3 align. In addition, the spacing between cavity modes of the laser cavity C3 is less than the full width at half maximum of the spectral components in the first comb-shaped reflection spectrum. Moreover, optical feedback in the laser cavity C3 follows a path going, in order, from the grating 332 to the dual-branch portion 321, one of the arms 322 and 323 of the ring resonator filter RF3, the ring-shaped waveguide 324, the other of the arms 322 and 323, the dual-branch portion 321, and then returning to the grating 332, where each optical feedback trip includes a circumnavigation of the ring-shaped waveguide 324. Therefore, similar to Embodiments 1 to 3, the wavelength tunable laser device 300 according to Embodiment 4 makes it possible to reduce the linewidth of laser light and achieve stable single-mode oscillation.

Furthermore, similar to in Embodiments 1 and 2, in the wavelength tunable laser device 300, laser oscillation wavelength tuning is implemented by performing a rough adjustment using the microheater 333 on the grating 332 and using the microheater 325 on the ring resonator filter RF3 to respectively tune the first comb-shaped reflection spectrum and the second comb-shaped reflection spectrum, and then performing a more precise adjustment using the microheater 329 on the phase adjusting portion 328 to tune the cavity length.

The wavelength tunable laser device 300 can be manufactured in the same manner as the wavelength tunable laser device 200 according to Embodiment 3. In other words, the components of the second waveguide 320 are formed using an SOI substrate, and then the separately manufactured first waveguide 310 is mounted in a recess CC in the substrate using a flip chip bonding process. This completes the wavelength tunable laser device 300.

The wavelength tunable laser device 300 according to Embodiment 4 makes it possible to reduce the linewidth of laser light and achieve stable single-mode oscillation similar to in Embodiments 1 and 2 and also has a small, compact footprint and makes it possible to output laser light with a high side mode suppression ratio similar to in Embodiment 3.

Embodiment 5

Figure 14:
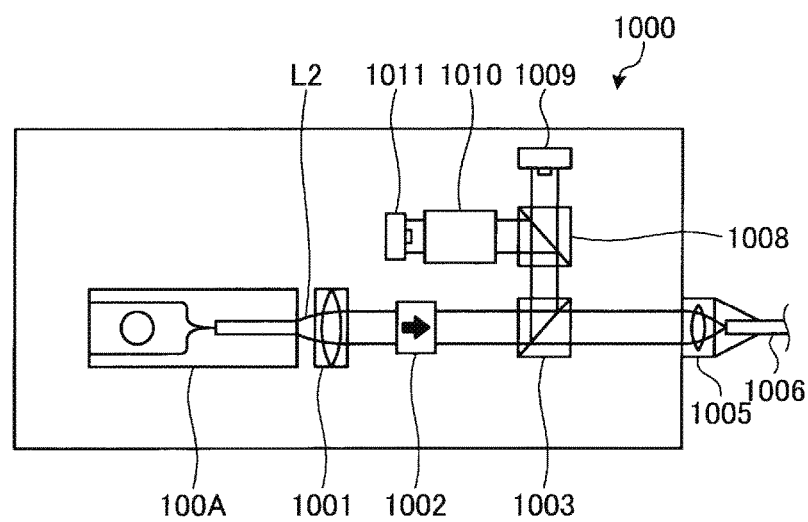
FIG. 14 schematically illustrates a laser module according to Embodiment 5.

Next, a laser module according to Embodiment 5 will be described. FIG. 14 schematically illustrates the laser module according to Embodiment 5. A laser module 1000 includes the wavelength tunable laser device 100A according to Embodiment 2, a collimating lens 1001, an optical isolator 1002, a beam splitter 1003, a condenser lens 1005, an optical fiber 1006, a power monitor photodiode (PD) 1009 (a light-receiving element), an etalon filter 1010, and a power monitor PD 1011. Moreover, the wavelength tunable laser device 100A is mounted on a thermoelectric cooler (not illustrated in the figure) for adjusting the temperature of the wavelength tunable laser device 100A. The wavelength tunable laser device 100A, the power monitor PDs 1009 and 1011, and the thermoelectric cooler are connected to an external controller.

The wavelength tunable laser device 100A is supplied with drive current by the controller, and laser light of a wavelength determined by factors such as the tunings of the grating layer 11ab, the ring resonator filter RF1, and the phase adjusting portion 11b as controlled by the controller via the microheaters 14, 15, and 25 is input to the SOA 101, which amplifies that light to the desired output intensity and outputs the resulting laser light L2. The collimating lens 1001 converts the laser light L2 output from the wavelength tunable laser device 100A to a parallel beam. The optical isolator 1002 transmits the laser light L2 converted to a parallel beam by the collimating lens 1001 in one direction only. The beam splitter 1003 transmits the majority of the laser light L2 that passes through the optical isolator 1002 but also splits a portion towards the power monitor PD 1009 side. The power monitor PD 1009 receives a portion of the laser light L2 split by a beam splitter 1008 and outputs current of a magnitude corresponding to the intensity of the received light. The etalon filter 1010 exhibits transmission wavelength characteristics having peaks that change periodically according to the order of multiple interference and transmits the laser light L2 that passes through the beam splitter 1008 at a transmittance determined by the transmission wavelength characteristics for the wavelength of the laser light L2. The period of the etalon filter 1010 is 50 GHz in terms of optical frequency, for example. The power monitor PD 1011 receives the laser light L2 that passes through the etalon filter 1010 and outputs current of a magnitude corresponding to the intensity of the received light. The condenser lens 1005 focuses the laser light L2 that passes through the beam splitter 1003 and couples that light into the optical fiber 1006. The laser light L2 coupled into the optical fiber 1006 propagates to outside of the module. The laser light L2 is used as signal light for optical fiber communications, for example. Here, a bulk material is used for the etalon filter 1010, but a waveguide filter can be used instead.

The laser module 1000 includes the wavelength tunable laser device 100A and therefore makes it possible to reduce the linewidth of the laser light L2 and achieve stable single-mode oscillation as well as to output higher power laser light L2. Furthermore, the currents output from the power monitor PDs 1009 and 1011 are monitored to monitor the intensity of the received light, thereby making it possible for the controller to lock the wavelength.

More specifically, to lock the wavelength, the controller changes and controls the drive current and temperature of the wavelength tunable laser device 100A such that the ratio of the intensity of the laser light monitored by the power monitor PD 1009 to the intensity of the laser light monitored by the power monitor PD 1011 after passing through the etalon filter 1010 is equal to a ratio at which the wavelength of the laser light L2 is equal to a desired wavelength. This makes it possible to set the wavelength of the laser light L2 to the desired wavelength (the locked wavelength).

Embodiment 6

Figure 15:
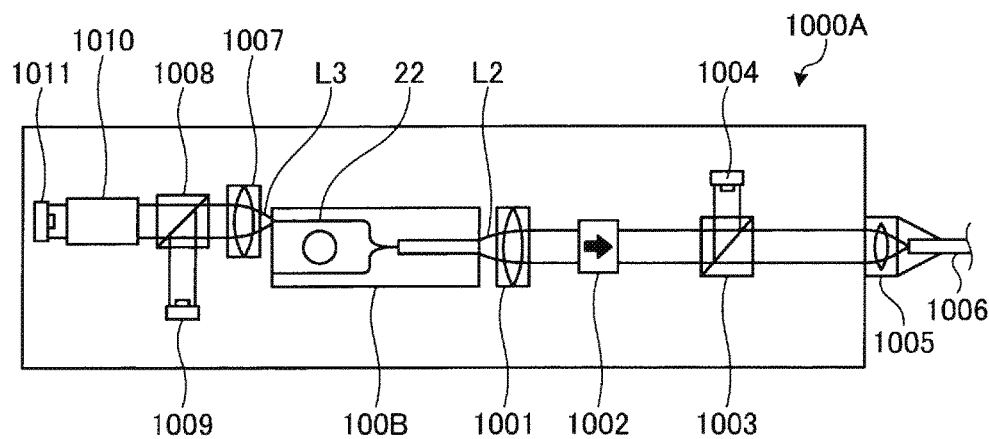
FIG. 15 schematically illustrates a laser module according to Embodiment 6.

Next, a laser module according to Embodiment 6 will be described. FIG. 15 schematically illustrates the laser module according to Embodiment 6. A laser module 1000A includes a wavelength tunable laser device 100B, a collimating lens 1001, an optical isolator 1002, a beam splitter 1003, a power monitor PD 1004, a condenser lens 1005, an optical fiber 1006, a collimating lens 1007, a beam splitter 1008, a power monitor photodiode PD 1009, an etalon filter 1010, and a power monitor PD 1011. Moreover, the wavelength tunable laser device 100B is mounted on a thermoelectric cooler (not illustrated in the figure) for adjusting the temperature of the wavelength tunable laser device 100B. The wavelength tunable laser device 100B; the power monitor PDs 1004, 1009, and 1011; and the thermoelectric cooler are connected to an external controller.

The functions of the collimating lens 1001, the optical isolator 1002, the beam splitter 1003, the power monitor PD 1004, the condenser lens 1005, and the optical fiber 1006 are the same as in the laser module 1000, and descriptions thereof will therefore be omitted here.

The wavelength tunable laser device 100B is designed such that in the wavelength tunable laser device 100 of the wavelength tunable laser device 100A, the coupling coefficient κ1 between the arm 22 and the ring-shaped waveguide 24 and the coupling coefficient κ2 between the arm 23 and the ring-shaped waveguide 24 have different values from one another. Here, setting the coupling coefficients κ1 and κ2 to have different values from one another results in the ring resonator filter RF1 becoming an asymmetric filter, which causes a portion of the oscillated laser light to be respectively output from the end faces of the arms 22 and 23 on the sides opposite to the sides connected to the dual-branch portion 21.

The collimating lens 1007 converts laser light L3 output from the end face of the arm 22 (that is, a portion of the oscillated laser light) to a parallel beam. The beam splitter 1008 transmits the majority of the laser light L3 that has been converted to a parallel beam but also splits a portion towards the power monitor PD 1009 side. The power monitor PD 1009 receives a portion of the laser light L3 split by the beam splitter 1008 and outputs current of a magnitude corresponding to the intensity of the received light. The etalon filter 1010 exhibits transmission wavelength characteristics having peaks that change periodically according to the order of multiple interference and transmits the laser light L3 that passes through the beam splitter 1008 at a transmittance determined by the transmission wavelength characteristics for the wavelength of the laser light L3. The period of the etalon filter 1010 is 50 GHz in terms of optical frequency, for example. The power monitor PD 1011 receives the laser light L3 that passes through the etalon filter 1010 and outputs current of a magnitude corresponding to the intensity of the received light.

The laser module 1000A includes the wavelength tunable laser device 100B and therefore makes it possible to reduce the linewidth of the laser light L2 and achieve stable single-mode oscillation as well as to output higher power laser light L2. Moreover, the currents output from the power monitor PDs 1009 and 1011 are monitored to monitor the intensity of the received light, thereby making it possible for the controller to lock the wavelength. Furthermore, monitoring the current output from the power monitor PD 1004 makes it possible to monitor the intensity of the laser light L2, thereby making it possible for the controller to implement power feedback control.

More specifically, to lock the wavelength, the controller changes and controls the drive current and temperature of the wavelength tunable laser device 100B such that the ratio of the intensity of the laser light monitored by the power monitor PD 1009 to the intensity of the laser light monitored by the power monitor PD 1011 after passing through the etalon filter 1010 is equal to a ratio at which the wavelength of the laser light L2 is equal to a desired wavelength. This makes it possible to set the wavelength of the laser light L2 to the desired wavelength (the locked wavelength).

Note that although in the embodiments described above the gratings are sampled gratings, the grating type is not limited to this example, and the gratings may alternatively be superstructure gratings or superimposed gratings.

Moreover, although in Embodiment 1 the grating layer 11*ab* is arranged near the active core layer 11*aa* and running directly above the active core layer 11*a*, the present invention is not limited to this example. For example, if an optical waveguiding layer is arranged connecting to the active core layer on the side thereof opposite to the phase adjusting portion, the grating layer may be arranged near the active core layer and directly above this optical waveguiding layer.

Furthermore, the present invention is not limited in any way by the embodiments described above. The present invention also includes other configurations obtained by appropriately combining the components described above. Moreover, additional effects and modification examples will be obvious to a person skilled in the art. Thus, the high-level aspects of the present invention are not limited by the embodiments described above, and various modifications are possible. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A wavelength tunable laser device, comprising:
a laser cavity formed of a grating and a reflecting mirror optically coupled to the grating, said reflecting mirror including a ring resonator filter;
a gain portion arranged within the laser cavity; and
a phase adjusting portion arranged within the laser cavity,
wherein the grating forms a first comb-shaped reflection spectrum,
wherein the ring resonator filter of the reflecting mirror includes:
  a ring-shaped waveguide; and
  two arms that are respectively optically coupled to different points of the ring-shaped waveguide,
wherein the reflecting mirror further includes a coupler that unites respective ends of said two arms of the ring resonator filter on one end and that is optically coupled to the grating on another end,
wherein the reflecting mirror forms a second comb-shaped reflection spectrum having peaks of a narrower full width at half maximum than a full width at half maximum of peaks in the first comb-shaped reflection spectrum at a wavelength interval differing from a wavelength interval of the first comb-shaped reflection spectrum,
wherein the grating and the reflecting mirror are configured such that one of the peaks in the first comb-shaped reflection spectrum and one of the peaks in the second comb-shaped reflection spectrum are overlappable on a wavelength axis,
wherein the wavelength tunable laser device is configured to adjust a refractive index of the phase adjusting portion such that one of the cavity modes of the laser cavity enters an overlap region in which said one of the peaks in the first comb-shaped reflection spectrum and said one of the peaks in the second comb-shaped reflection spectrum are overlapped, thereby achieving laser oscillation at a wavelength of said one of the cavity modes, wherein the laser cavity is configured such that a spacing between cavity modes is narrower than the full width at half maximum of the peaks in the first comb-shaped reflection spectrum, and such that two or more of the cavity modes are included within a peak in the first comb-shaped reflection spectrum, wherein the wavelength tunable laser device is configured to adjust the refractive index of the phase adjusting portion so as to shift said two or more cavity modes on the wavelength axis and align only one of said two or more cavity modes with said overlap region, thereby achieving single mode laser oscillation at said one of said two or more cavity modes, wherein the peaks in the second comb-shaped reflection spectrum protrude up higher than the peaks in the first comb-shaped reflection spectrum, and wherein the refractive index of the phase adjustable portion is adjustable while maintaining a state in which the peaks in the second comb-shaped reflection spectrum protrude up higher than the peaks in the first comb-shaped reflection spectrum.

2. The wavelength tunable laser device according to claim 1, wherein an optical feedback path within the laser cavity goes from the grating to one of the two arms, the ring-shaped waveguide, and another of the two arms and then returns to the grating.

3. The wavelength tunable laser device according to claim 1, further comprising:
a first refractive index changing unit that changes a refractive index of a material constituting at least a part of the grating; and
a second refractive index changing unit that changes a refractive index of a material constituting at least a part of the ring resonator filter,
wherein by operating at least one of the first refractive index changing unit and the second refractive index changing unit, one of the peaks in the first comb-shaped reflection spectrum and one of the peaks in the second comb-shaped reflection spectrum are overlapped on the wavelength axis.

4. The wavelength tunable laser device according to claim 3, further comprising:
a third refractive index changing unit that adjusts the refractive index of the phase adjusting portion.

5. The wavelength tunable laser device according to claim 4, wherein the first, second, and third refractive changing units are resistance heaters that are respectively arranged adjacent to the grating, the ring-shaped waveguide, and the phase adjusting portion and that respectively thermally change refractive indices of respective constituent materials thereof.

6. The wavelength tunable laser device according to claim 1, wherein the grating is a sampled grating.

7. The wavelength tunable laser device according to any one of claim 1, wherein the grating is a superstructure grating.

8. The wavelength tunable laser device according to claim 1, wherein the grating is a superimposed grating.

9. The wavelength tunable laser device according to claim 1, wherein the gain portion has an elongated shape extending in a laser light propagation direction, and the grating is arranged adjacent to the gain portion with respect to said laser light propagation direction.

10. The wavelength tunable laser device according to claim 1, wherein the gain portion has an elongated shape extending in a laser light propagation direction, and the grating is arranged running along the elongated shape of the gain portion.

11. The wavelength tunable laser device according to claim 1,
wherein the gain portion is arranged within a buried waveguide structure, and
wherein the ring resonator filter has a high-mesa waveguide structure.

12. The wavelength tunable laser device according to claim 1,
wherein the gain portion is arranged within a ridge waveguide structure, and
wherein the ring resonator filter has a high-mesa waveguide structure.

13. The wavelength tunable laser device according to claim 1, wherein the ring resonator filter further includes multimode interference waveguides that respectively optically couple the two arms to the ring-shaped waveguide.

14. The wavelength tunable laser device according to claim 1, wherein the ring resonator filter further includes directionally coupling waveguides that respectively optically couple the two arms to the ring-shaped waveguide.

15. The wavelength tunable laser device according to claim 1, further comprising:
a semiconductor optical amplifier that optically amplifies laser light output from the laser cavity.

16. The wavelength tunable laser device according to claim 1, wherein coupling coefficients of the two arms that are optically coupled to the ring-shaped waveguide in the ring resonator filter are different from one another.

17. A laser module, comprising:
the wavelength tunable laser device according to claim 16; and
a light-receiving element that receives a portion of laser light output from an end face of one of the two arms of the ring resonator filter on an end that, among ends of that one arm, is not united by the coupler.

18. A laser module comprising the wavelength tunable laser device according to claim 1.

19. A wavelength tunable laser device, comprising:
a laser cavity formed of a grating and a reflecting mirror optically coupled to the grating, said reflecting mirror including a ring resonator filter;
a gain portion arranged within the laser cavity; and
a phase adjusting portion arranged within the laser cavity,
wherein the grating forms a first comb-shaped reflection spectrum,
wherein the ring resonator filter of the reflecting mirror includes:
a ring-shaped waveguide; and
two arms that are respectively optically coupled to different points of the ring-shaped waveguide,
wherein the reflecting mirror further includes a coupler that unites respective ends of said two arms of the ring resonator filter on one end and that is optically coupled to the grating on another end,
wherein the reflecting mirror forms a second comb-shaped reflection spectrum having peaks of a narrower full width at half maximum than a full width at half maximum of peaks in the first comb-shaped reflection spectrum at a wavelength interval differing from a wavelength interval of the first comb-shaped reflection spectrum, wherein the grating and the reflecting mirror are configured such that one of the peaks in the first comb-shaped reflection spectrum and one of the peaks in the second comb-shaped reflection spectrum are overlappable on a wavelength axis, wherein the wavelength tunable laser device is configured to adjust a refractive index of the phase adjusting portion such that one of the cavity modes of the laser cavity enters an overlap region in which said one of the peaks in the first comb-shaped reflection spectrum and said one of the peaks in the second comb-shaped reflection spectrum are overlapped, thereby achieving laser oscillation at a wavelength of said one of the cavity modes, wherein the laser cavity is configured such that a spacing between cavity modes is narrower than the full width at half maximum of the peaks in the first comb-shaped reflection spectrum, and such that two or more of the cavity modes are included within a peak in the first comb-shaped reflection spectrum, wherein the wavelength tunable laser device is configured to adjust the refractive index of the phase adjusting portion so as to shift said two or more cavity modes on the wavelength axis and align only one of said two or more cavity modes with said overlap region, thereby achieving single mode laser oscillation at said one of said two or more cavity modes, wherein the peaks in the first comb-shaped reflection spectrum have a Gaussian shape, wherein the peaks in the second comb-shaped reflection spectrum have a double exponential distribution shape, wherein the double exponential distribution-shaped peaks in the second comb-shaped reflection spectrum protrude up higher than the Gaussian-shaped peaks in the first comb-shaped reflection spectrum, and wherein the refractive index of the phase adjustable portion is adjustable while maintaining a state in which the double exponential distribution-shaped peaks in the second comb-shaped reflection spectrum protrude up higher than the Gaussian-shaped peaks in the first comb-shaped reflection spectrum.

20. A wavelength tunable laser device, comprising:

a laser cavity formed of a grating and a reflecting mirror optically coupled to the grating, said reflecting mirror including a ring resonator filter;

a gain portion arranged within the laser cavity; and a phase adjusting portion arranged within the laser cavity, wherein the grating forms a first comb-shaped reflection spectrum, wherein the ring resonator filter of the reflecting mirror includes:

a ring-shaped waveguide; and two arms that are respectively optically coupled to different points of the ring-shaped waveguide, wherein the reflecting mirror further includes a coupler that unites respective ends of said two arms of the ring resonator filter on one end and that is optically coupled to the grating on another end, wherein the reflecting mirror forms a second comb-shaped reflection spectrum having peaks of a narrower full width at half maximum than a full width at half maximum of peaks in the first comb-shaped reflection spectrum at a wavelength interval differing from a wavelength interval of the first comb-shaped reflection spectrum, wherein the grating and the reflecting mirror are configured such that one of the peaks in the first comb-shaped reflection spectrum and one of the peaks in the second comb-shaped reflection spectrum are overlappable on a wavelength axis, wherein the wavelength tunable laser device is configured to adjust a refractive index of the phase adjusting portion such that one of the cavity modes of the laser cavity enters an overlap region in which said one of the peaks in the first comb-shaped reflection spectrum and said one of the peaks in the second comb-shaped reflection spectrum are overlapped, thereby achieving laser oscillation at a wavelength of said one of the cavity modes, wherein the laser cavity is configured such that a spacing between cavity modes is narrower than the full width at half maximum of the peaks in the first comb-shaped reflection spectrum, and such that two or more of the cavity modes are included within a peak in the first comb-shaped reflection spectrum, wherein the wavelength tunable laser device is configured to adjust the refractive index of the phase adjusting portion so as to shift said two or more cavity modes on the wavelength axis and align only one of said two or more cavity modes with said overlap region, thereby achieving single mode laser oscillation at said one of said two or more cavity modes, and wherein the ring resonator filter further includes directionally coupling waveguides that respectively optically couple the two arms to the ring-shaped waveguide.

* * * * *